(12) United States Patent
Ha

(10) Patent No.: US 9,153,780 B2
(45) Date of Patent: Oct. 6, 2015

(54) SEMICONDUCTOR DEVICE AND METHOD OF FABRICATING THE SAME

(71) Applicant: SK hynix Inc., Icheon (KR)

(72) Inventor: Taejung Ha, Icheon (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 14/696,059

(22) Filed: Apr. 24, 2015

(65) Prior Publication Data

US 2015/0228896 A1 Aug. 13, 2015

Related U.S. Application Data

(62) Division of application No. 14/044,752, filed on Oct. 2, 2013, now Pat. No. 9,040,952.

(51) Int. Cl.
*H01L 45/00* (2006.01)

(52) U.S. Cl.
CPC ............ *H01L 45/146* (2013.01); *H01L 45/124* (2013.01); *H01L 45/1253* (2013.01)

(58) Field of Classification Search
CPC .............. H01L 45/1233; H01L 45/146; H01L 27/2463; H01L 27/2409; H01L 45/06
USPC .................................................. 257/4; 438/382
See application file for complete search history.

(56) References Cited

U.S. PATENT DOCUMENTS

| 2010/0227438 A1* | 9/2010 | Ha .................................. 438/129 |
| 2011/0147691 A1* | 6/2011 | Yasutake ........................... 257/2 |
| 2013/0168628 A1* | 7/2013 | Hwang ............................. 257/1 |

FOREIGN PATENT DOCUMENTS

KR 10-2010-0083402 A 7/2010

* cited by examiner

*Primary Examiner* — David Vu
*Assistant Examiner* — Jonathan Han

(57) ABSTRACT

A semiconductor device includes a first conductive layer extending in a first direction, a second conductive layer extending in a second direction and disposed over the first conductive layer, the first and second directions being substantially perpendicular to each other, and a variable resistance layer disposed over the first conductive layer, the variable resistance layer extending in the second direction. An upper portion of the variable resistance layer is disposed between lower portions of two neighboring second conductive layers including the second conductive layer.

10 Claims, 19 Drawing Sheets

US 9,153,780 B2

SEMICONDUCTOR DEVICE AND METHOD OF FABRICATING THE SAME

CROSS-REFERENCE TO RELATED APPLICATIONS

The present application is a divisional of U.S. patent application Ser. No. 14/044,752 filed on Oct. 2, 2013, the disclosure of which is hereby incorporated by reference in its entirety.

BACKGROUND

The background description presented herein is for the purpose of generally providing context for the disclosure. Work of the presently named inventor(s), to the extent such work is described in this background section, as well as aspects of the description that may not otherwise qualify as prior art at the time of filing, are neither expressly nor impliedly admitted as prior art against the present disclosure.

Modern electronic devices such as computers, portable communication devices, and the like include semiconductor memories to store data for performing various tasks. Some semiconductor memories store data using a variable resistance element, which has different resistance states in response to a voltage or current applied thereto. These semiconductor memories include a resistive random access memory (RRAM), a phase change random access memory (PCRAM), a ferroelectric random access memory (FRAM), a magneto-resistive random access memory (MRAM), an E-fuse, and the like.

As electronic devices become smaller and more versatile, the semiconductor memories included in the electronic devices continue to decrease in size and increase in degree of integration. Such continued scaling of the semiconductor memories leads to manufacturing issues such as increasing complexity of fabrication processes and manufacturing costs.

SUMMARY

Various embodiments are directed to a semiconductor device and a method of fabricating the same, which reduce a number of manufacturing processes and manufacturing costs.

An embodiment is directed to a semiconductor device including a memory cell that has an electrode formed using a sidewall spacer fabrication process.

In an embodiment, a semiconductor device comprises a first conductive layer extending in a first direction; a second conductive layer extending in a second direction and disposed over the first conductive layer, the first and second directions being substantially perpendicular to each other; and a variable resistance layer disposed over the first conductive layer, the variable resistance layer extending in the second direction. An upper portion of the variable resistance layer is disposed between lower portions of two neighboring second conductive layers including the second conductive layer.

In an embodiment, a semiconductor device comprises a first conductive layer extending in a first direction; a second conductive layer extending in a second direction and disposed over the first conductive layer, the first and second directions being substantially perpendicular to each other; an insulation layer disposed between two neighboring second conductive layers including said second conductive layer; and a variable resistance layer extending in the second direction and disposed between the first and second conductive layers. The second conductive layer is formed by performing a process of forming sidewall spacers on sidewalls of the insulation layer.

In an embodiment, a method of fabricating a semiconductor device comprises forming a first conductive layer over a substrate, the first conductive layer extending in a first direction; forming a variable resistance layer over the first conductive layer, the variable resistance layer extending in a second direction, the first and second directions being substantially perpendicular to each other; and forming two neighboring second conductive layers extending in the second direction over the first conductive layer so that an upper portion of the variable resistance layer is disposed between lower portions of the two neighboring second conductive layers. The forming of the two neighboring second conductive layers includes forming sidewall spacers on both sidewalls of the upper portion of the variable resistance layer so that upper portions of the sidewall spacers are disposed at a higher level than a top surface of the variable resistance layer; and forming the two neighboring second conductive layers by removing a top portion of the sidewall spacers by a predetermined depth.

In an embodiment, a method of fabricating a semiconductor device comprises forming a first conductive layer over a substrate, the first conductive layer extending in a first direction; forming a variable resistance layer over the first conductive layer, the variable resistance layer extending in a second direction, the first and second directions being substantially perpendicular to each other; and forming a second conductive layer over the variable resistance layer extending in the second direction. The forming of the second conductive layer includes forming a sidewall spacer over the variable resistance layer and removing a top portion of the sidewall spacer by a predetermined depth.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1A:
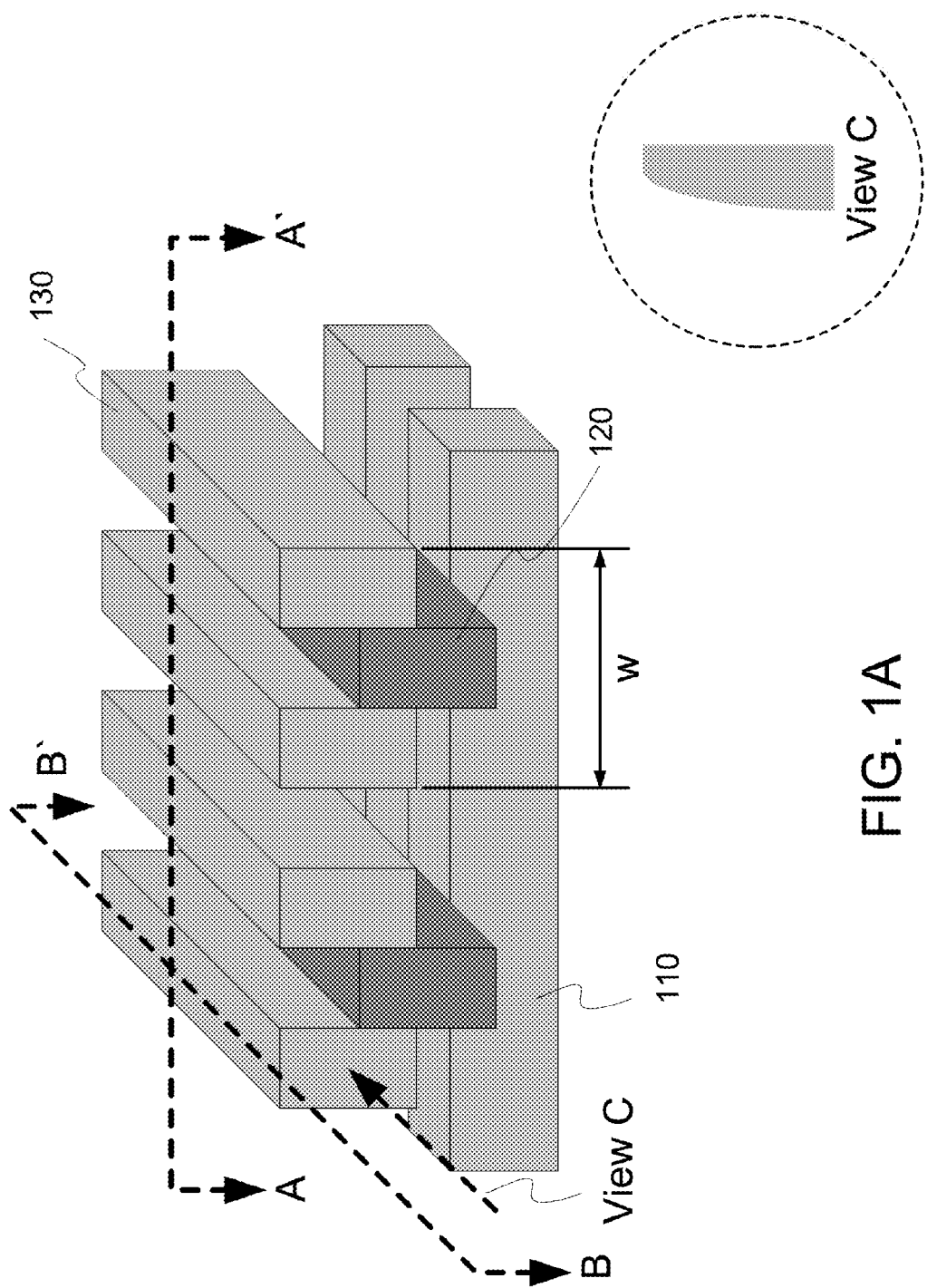
FIG. 1A is a perspective view illustrating a semiconductor device in accordance with an embodiment.

Various embodiments will be described below in more detail with reference to the accompanying drawings. The present disclosure may, however, include embodiments in different forms and should not be construed as limited to the embodiments set forth herein. Rather, these embodiments are provided so that this disclosure will be thorough and complete, and will fully convey the scope of the present disclosure to those skilled in the art.

Throughout the disclosure, like reference numerals refer to like parts throughout the various figures and embodiments of the present invention. The drawings are not necessarily to scale and in some instances, proportions may have been exaggerated in order to clearly illustrate features of the embodiments.

FIG. 1A is a perspective view illustrating a semiconductor device in accordance with an embodiment of the disclosure. The semiconductor device includes a first conductive layer 110 that extends in a first direction (e.g., the direction of a line A-A') and a second conductive layer 130 that extends in a second direction (e.g., the direction of a line B-B'), which crosses the first direction. In an embodiment, the first direction is substantially perpendicular to the second direction.

The semiconductor device also includes a variable resistance layer 120 that extends in the second direction and is disposed between the first conductive layer 110 and the second conductive layer 130. The variable resistance layer 120 is formed over the first conductive layer 110 and disposed between lower portions of two neighboring second conductive layers 130.

In an embodiment, the first and second conductive layers 110 and 130 are configured to function as electrodes. Although not shown in the perspective view of FIG. 1A, a cross-section of the first and second conductive layers 110 and 130 is similar to a cross-section of a sidewall spacer whose top portion has been removed, as shown in View C. In a memory cell array of the semiconductor device, the first conductive layer 110 may correspond to a bit line, and the second conductive layer 130 may correspond to a word line, and vice versa. The variable resistance layer 120 corresponds to a variable resistance element.

In an embodiment, each variable resistance layer 120 is shared by two upper electrodes, i.e., two second conductive layers 130 so that two memory cells are formed between the two upper electrodes and one lower electrode, i.e., one first conductive layer 110. As shown in FIG. 1A, an upper portion of the variable resistance layer 120 is disposed between lower portions of two second conductive layers 130. Since one variable resistance layer 120 is shared by two second conductive layers 130, the two memory cells are formed within a width w, which includes widths of two second conductive layers 130 and a width of one variable resistance layer 120.

In a conventional semiconductor device, a memory cell includes one variable resistance layer coupled to a single upper electrode. In a memory cell in accordance with an embodiment, however, a variable resistance layer is coupled to two upper electrodes. In this manner, a number of variable resistance layers 120 may be reduced and a degree of integration of memory cells in the semiconductor device remains high, compared to a memory cell having one variable resistance layer over which one upper electrode is disposed.

The first and second conductive layers 110 and 130 may include any material that is electrically conductive to transmit electrical signals therethrough. In an embodiment, the material includes metal such as platinum (Pt), tungsten (W), aluminum (Al), copper (Cu), or tantalum (Ta), or metal nitride such as titanium nitride (TiN) or tantalum nitride (TaN).

The variable resistance layer 120 acting as the variable resistance element has a resistance state that changes in response to an input signal (e.g., voltage or current) applied to the first and second conductive layers 110 and 130. In an embodiment, in order to store a two-bit data (e.g., logic high and low data), the variable resistance layer 120 has two different resistance states (e.g., high and low resistance states) determined depending on the input signal. For example, the high and low resistance states correspond to logic high and low data, respectively.

The variable resistance layer 120 may include any material having variable resistance characteristics. In an embodiment, the material includes a perovskite-based material, metal oxide, transition metal oxide, a phase change material (e.g., a chalcogenide-based material), a ferroelectric material, a ferromagnetic material, or the like. For example, the perovskite-based material includes $PCMO(Pr_{0.7}Ca_{0.3}MnO_3)$, $LCMO(La_{1-x}CaxMnO_3)$, $BSCFO(Ba_{0.5}Sr_{0.5}CO_{0.8}Fe_{0.2}O_{3-\delta})$, $YBCO(YBa_2Cu_3O_{7-x})$ (Ba, Sr) $TiO_3$ (Cr, Nb-doped), $SrZrO_3$ (Cr, V-doped), (La, Sr) $MnO_3$, $Sr_{1-x}La_xTiO_3$, $La_{1-x}Sr_xFeO_3$, $La_{1-x}Sr_xCoO_3$, $SrFeO_{2.7}$, $LaCoO_3$, $RuSr_2GdCu_2O_3$, $YBa_2Cu_3O_7$, and the metal oxide includes $TiO_{2-x}$, $Al_2O_3$, $NiO_x$, $Cu_xO$, $ZrO_2$, $MnO_2$, $HfO_2$, $WO_3$, $Ta_2O_{5-x}$, $Nb_2O_5$, $VO_2$, $Fe_3O_4$, or the like. The chalcogenide-based material includes $Ge_xSe_{1-x}$(Ag,Cu,Te-doped), $Ag_2S$, $Cu_2S$, $CdS$, $ZnS$, $CeO_2$, or the like.

The variable resistance layer 120 may include a single layer or a plurality of layers. In an embodiment, the variable resistance layer 120 has a stacked layer structure of at least two different layers, which show the variable resistance characteristics in combination.

Figure 1B:
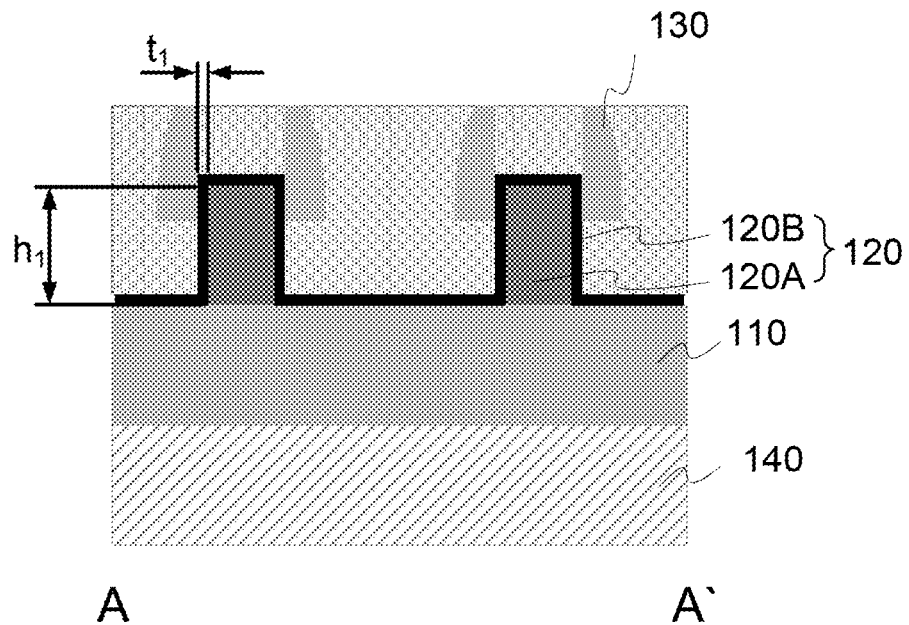
FIGS. 1B and 1C are cross-sectional views each illustrating a semiconductor device in accordance with an embodiment.
Figure 1C:
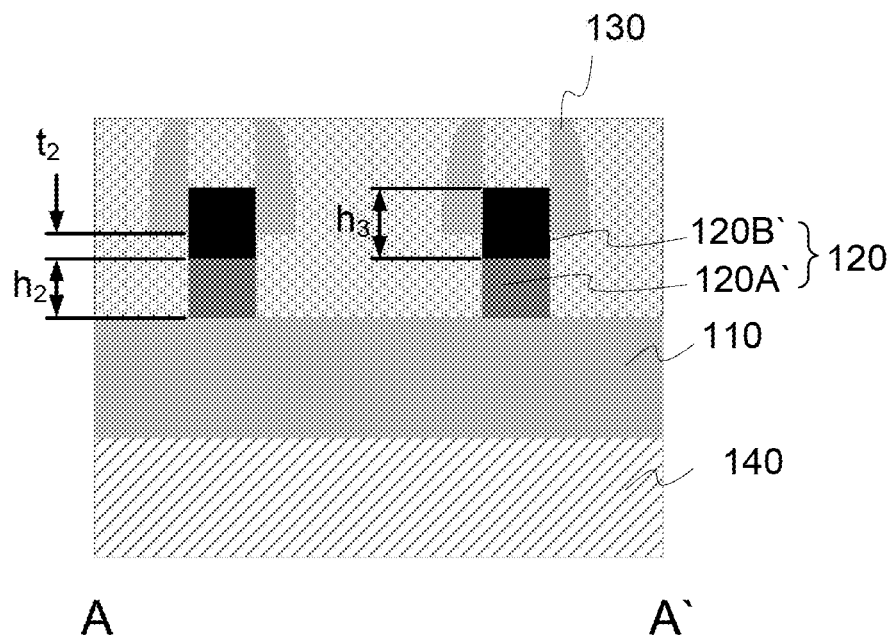

Referring to FIGS. 1B and 1C, the variable resistance layer 120 has a stacked layer structure that may includes a reservoir layer 120A or 120A' and a tunnel barrier layer 120B or a selector layer 120B' over the first conductive layer 110 and a substrate 140. In an embodiment, the selector layer 120B' has a multi-layer structure including a tunnel barrier layer.

The reservoir layer 120A or 120A' is provided to supply oxygen vacancies to the tunnel barrier layer 120B or the selector layer 120B', so that a plurality of current paths (or filaments) is formed in the tunnel barrier layer 120B or the selector layer 120B'. Specifically, when a voltage is applied to the first and second conductive layers 110 and 130 to create an electric field across the reservoir layer 120A or 120A' and the tunnel barrier layer 120B or the selector layer 120B', oxygen vacancies migrate from the reservoir layer 120A or 120A' into the tunnel barrier layer 120B or the selector layer 120B'.

When the applied voltage is higher than a predetermined value so that a sufficient number of the oxygen vacancies are injected into the tunnel barrier layer 120B or the selector layer 120B', a plurality of filaments is formed in the tunnel barrier layer 120B or the selector layer 120B'. As a result, a resistance value of the tunnel barrier layer 120B or the selector layer 120B' decreases, and thus a total resistance value of the variable resistance layer 120 is "set" to a low resistance state corresponding to, e.g., the logic low data.

On the other hand, the variable resistance layer 120 may be "reset" to a high resistance state corresponding to, e.g., the logic high data. For example, in a unipolar switching mode, a portion of the filaments formed in the tunnel barrier layer 120B or the selector layer 120B' disappears by diffusion of the vacancies at an elevated temperature after a given voltage is applied to an electrode for a predetermined time. Alternatively, in a bipolar switching mode, when a negative voltage is applied to an electrode, the negative voltage drives electrons into the tunnel barrier layer 120B or the selector layer 120B' to fill the vacancies in a portion of the filaments formed near the electrode. As a result, the portion of the filaments formed near the electrode disappears and the variable resistance layer 120 is reset to the high resistance state.

In order to form filaments in the tunnel barrier layer 120B or the selector layer 120B', the tunnel barrier layer 120B or the selector layer 120B' includes a filament formation region having a predetermined thickness, e.g., $t_1$ in FIG. 1B or $t_2$ in FIG. 1C. The predetermined thickness of the filament formation region is small enough to allow an electric field to penetrate through the tunnel barrier layer 120B or the selector layer 120B', and thus the filaments to be formed in the tunnel barrier layer 120B or the selector layer 120B'. On the other hand, the predetermined thickness is large enough to prevent an electrical short from occurring through the tunnel barrier layer 120B or the selector layer 120B'. For example, the thickness $t_1$ or $t_2$ is in a range of 1 nm to 5 nm.

The selector layer 120B' is typically configured to prevent a sneak current from flowing through unselected memory cells. In another embodiment, the selector layer 120B' includes a tunnel barrier layer. A height $h_3$ of the selector layer 120B' may range from 5 nm to 30 nm.

A height $h_1$ of the reservoir layer 120A is greater than the thickness $t_1$ of the filament formation region in the tunnel barrier layer 120B. A height $h_2$ of the reservoir layer 120A' is greater than the thickness of $t_2$ of the filament formation region in the selector layer 120B'. For example, the height $h_1$ or $h_2$ ranges from 10 nm to 50 nm.

In an embodiment, the tunnel barrier layer 120B or the selector layer 120B' includes a substance (e.g., $TiO_2$, $Ta_2O_{5f}$ etc.) that satisfies a stoichiometric ratio. In an embodiment, the reservoir layer 120A or 120A' includes an oxygen-deficient metal oxide material. The oxygen-deficient oxide material includes a substance that is deficient in oxygen compared to a substance that satisfies the stoichiometric ratio. For example, the reservoir layer 120A or 120A' includes $TiO_x$ (x<2) or $TaO_y$ (y<2.5).

A semiconductor device may have a multi-layer structure including a plurality of vertically arranged variable resistance layers. In an embodiment, the semiconductor device includes a second variable resistance layer (not shown) that extends in the first direction (the line A-A') and formed over the second conductive layer 130. In this embodiment, similar to the variable resistance layer 120, the second variable resistance layer (not shown) is disposed between lower portions of two neighboring third conductive layers (not shown) that extend in the first direction. The third conductive layers are formed over the second variable resistance layer in the same manner as the second conductive layer 130. Additional conductive layers (not shown) and additional variable resistance layers (not shown) may be stacked in the same manner as described above.

In an embodiment, when a vertically stacked memory cell including the first variable resistance layer 120 is selected, the second conductive layer 130 may function as a bit line and the first conductive layer 110 may function as a word line. On the other hand, when another memory cell including the second variable resistance layer is selected, the second conductive layer 130 may function as a word line and the third conductive layer may function as a bit line. As such, each of the conductive layers may function as a bit line or a word line depending on which of adjacent memory cells is selected.

FIGS. 2A to 2F are cross-sectional views illustrating a method for fabricating the first conductive layer 110 of FIG. 1A in accordance with an embodiment. FIGS. 2A to 2F illustrate cross-sectional views taken along the line B-B' of FIG. 1A.

Figure 2A:
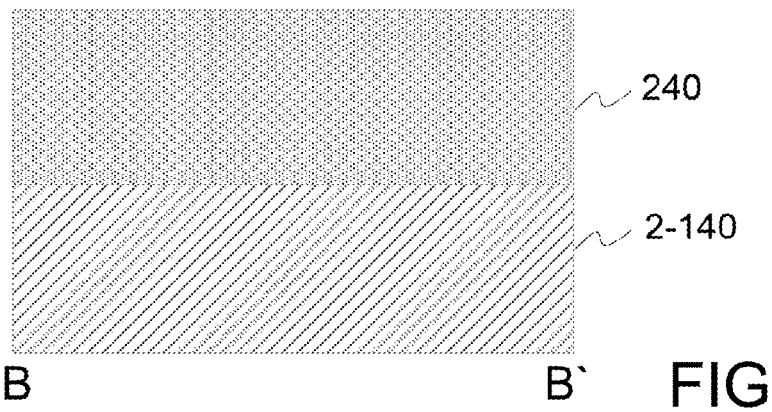
FIGS. 2A-2F are cross-sectional views illustrating a method for fabricating a first conductive layer of FIG. 1A in accordance with an embodiment of the semiconductor device.

Referring to FIG. 2A, a substrate 2-140 is provided. In an embodiment, the substrate 2-140 includes a semiconductor substrate or an insulator substrate.

A first insulation layer 240 is formed over the substrate 2-140. The first insulation layer 240 includes a material that is the same as a material used to electrically insulate the first conductive layer 110 from the second conductive layer 130 in FIG. 1A. In an embodiment, the first insulation layer 240 includes an oxide layer. In an embodiment, the oxide layer is deposited using a chemical vapor deposition (CVD) method such as a low-pressure (LP) CVD or a plasma-enhanced (PE) CVD, or a bias sputtering method. In another embodiment, the oxide layer is deposited by combining a high-density plasma (HDP) CVD with the bias sputtering method.

Figure 2B:
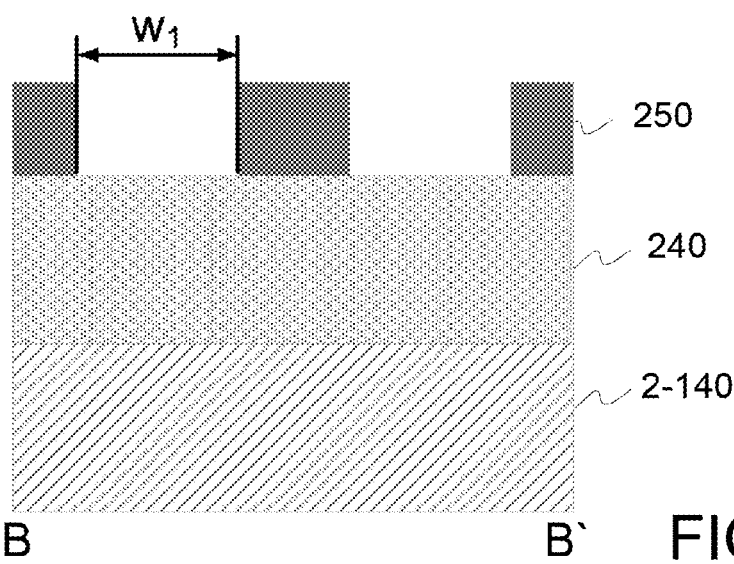

Referring to FIG. 2B, a photoresist material (not shown) is formed over the first insulation layer 240 and then patterned using a photolithography method, thereby forming photoresist layers 250 separated by an opening that has width $w_1$. In an embodiment, an excimer laser source (e.g. KrF, ArF, etc.) is used to implement a photolithography resolution enhancement technique, for instance, immersion lithography. In an embodiment, the width $w_1$ is approximately 40 nm.

Figure 2C:
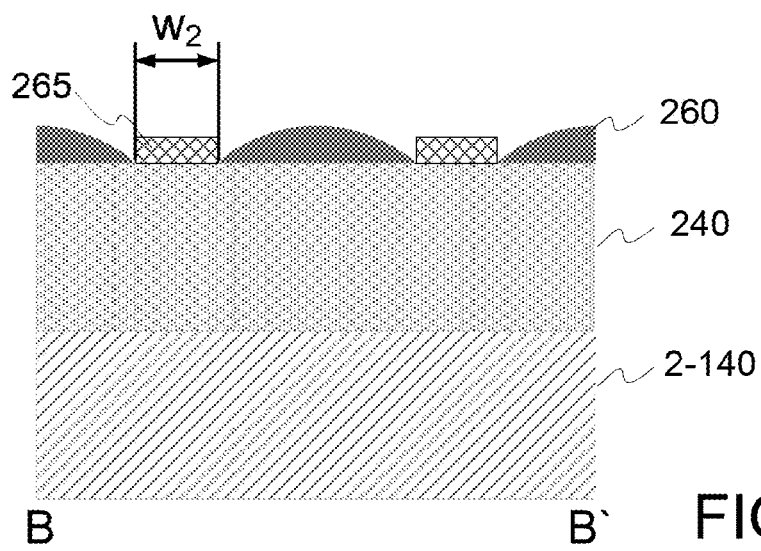

Referring to FIG. 2C, in order to reduce the width $w_1$ of the opening (e.g., approximately 40 nm), which is defined by two adjacent photoresist layers 250 in FIG. 2B, additional resolution enhancement techniques, such as reflow of the photoresist layers 250 and resolution enhancement of lithography by assist of chemical shrink (RELACS), are performed on the photoresist layers 250. As a result, photoresist patterns 260 having an opening width $w_2$ are formed. In an embodiment, the opening width $w_2$ is approximately 20 nm. The opening width $w_2$ (e.g., approximately 20 nm) defined by two neighboring photoresist patterns 260 is smaller than the corresponding opening width $w_2$ (e.g., approximately 40 nm) defined by the two neighboring photoresist layers 250 in FIG. 2B.

Subsequently, a hard mask layer 265 is deposited over portions of the first insulation layer 240 that are exposed by the photoresist patterns 260.

Figure 2D:
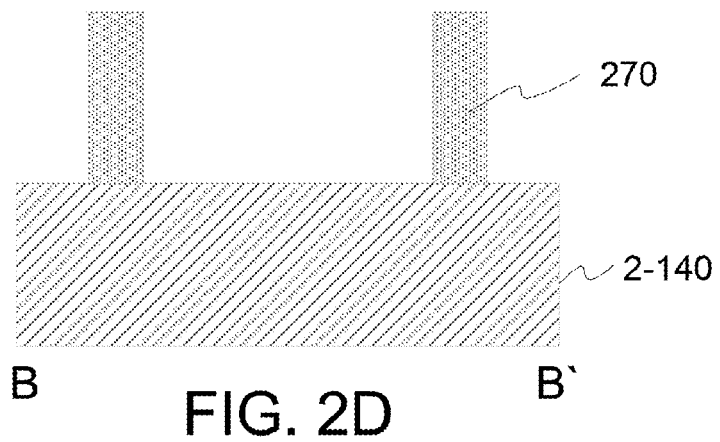

Referring to FIG. 2D, the photoresist patterns 260 are removed, and then the first insulation layer 240 is etched using the hard mask layer 265 as an etch mask. An etching rate of the hard mask layer 265 is lower than that of the first insulation layer 240. As a result, an insulation pattern 270 is formed. In an embodiment, an anisotropic etching process, such as plasma etching (PE), reactive ion etching (RIE), high-density plasma etching (HDPE), or the like, is performed in a substantially vertical direction to form the insulation pattern 270. Subsequently, the remaining portions of the hard mask layer 265 are removed.

Figure 2E:
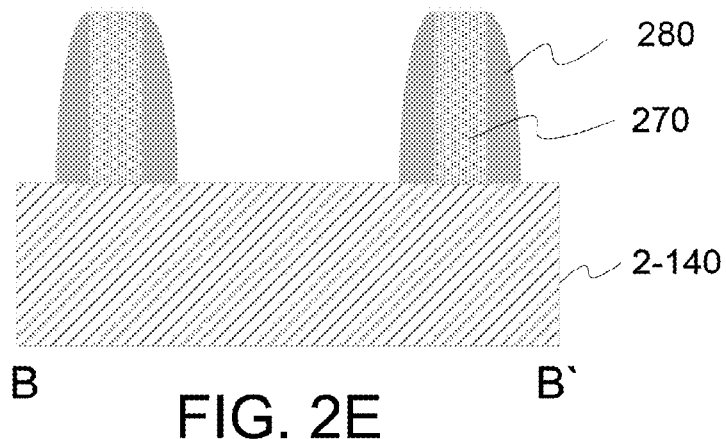

Referring to FIG. 2E, after forming the insulation pattern 270, a conductive film (not shown) is conformally deposited along a surface of the resultant structure including the substrate 2-140 and the insulation pattern 270. After that, the conductive film is etched back in a substantially vertical direction using a highly anisotropic etching method (e.g., PE, RIE, HDPE, or the like) until the deposited conductive film remains only on sidewalls of the insulation pattern 270. As a result, a conductive pattern 280 is formed to have a cross-section that is similar to a sidewall spacer, as illustrated in FIG. 2E.

Specifically, the conductive pattern 280 has a first side in contact with the insulation pattern 270. In an embodiment, the first side is substantially vertical with respect to the substrate 2-140 along the surface contacting the insulation pattern 270. If a top surface of the insulation pattern 270 is slightly smaller than a bottom surface of the insulation pattern 270, a first side of the conductive pattern 280 contacting the insulation pattern 270 may be provided at a slight angle with respect to the substrate 2-140.

The conductive pattern 280 has a curved portion at a second side. The curved portion includes a plurality of subsections, each of which corresponds to a circular arc approximating the curved portion at a point of the curved portion. A curvature is defined as an inverse of a radius of each subsection, (i.e., the circular arc at a point of the curved portion). Thus, the curved portion has the plurality of curvatures. These curvatures of the second side of the conductive pattern 280 results from the anisotropic etching of the conformally deposited conductive film. In an embodiment, the second side includes a curved upper portion corresponding to one finite curvature and a vertical lower portion corresponding to zero curvature (i.e., infinite radius). In other embodiments, due to non-uniformity of the conductive film and imperfect anisotropic etching, the second side may have a curved portion including a plurality of subsections with different curvatures. The plurality of curvatures of the second side may change from a top portion of the second side to a bottom portion of the second side. In an embodiment, the second side has subsections with curvatures decreasing from the top portion to the bottom portion of the second side.

This configuration of the conductive pattern 280, where the sidewall of one side has a curved portion and the sidewall of the other side is vertical in a cross-sectional view, is similar to a shape that a sidewall spacer often has in a semiconductor device. Thus, as described in more detail below, a method for forming a conductive pattern according to an embodiment may be similar to that of forming a sidewall spacer having such a shape. Accordingly, for convenience of description, a conductive pattern and a method for forming the same in accordance with an embodiment may be described herein as that of a sidewall spacer. In addition, as used in this disclosure, the term "sidewall spacer shape" and similar terms refer to a configuration where, in a cross-sectional view, a structure has one sidewall with at least one curved portion and an opposing sidewall that is substantially vertical with respect to a substrate. However, one of skilled in the art will understand that such references are merely for convenience of description and are not intended to limiting.

Figure 2F:
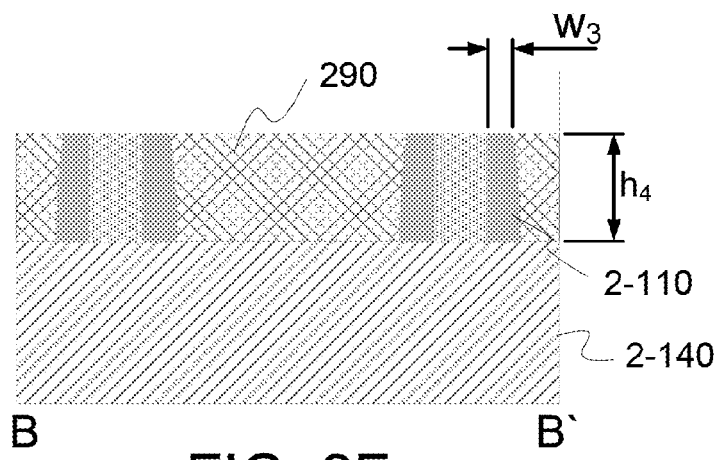

Referring to FIG. 2F, a second insulation material fills spaces between the conductive patterns 280 and then the resultant structure is planarized to form a planarized insulation layer 290. During the planarization process, e.g. chemical mechanical planarization, upper portions of the conductive pattern 280 and the insulation pattern 270 are also removed by a predetermined depth. As a result, a conductive layer 2-110, which corresponds to the remaining portion of the conductive pattern 280, is formed. For example, a height $h_4$ of the conductive layer 2-110 ranges from 40 nm to 100 nm. The conductive layer 2-110 includes a first side in contact with the remaining portion of the insulation pattern 270, and a second side in contact with the planarized insulation layer 290. A curvature of a top portion of the second side is determined by the planarization process. An area of the top surface of the conductive layer 2-110 over which the variable resistance layer 120 (see FIG. 1A) will be formed is also determined by the planarization process. For example, a width $w_3$ of the top portion of the conductive layer 2-110 ranges from 10 nm to 20 nm. The conductive layer 2-110 functions as an electrode of a memory cell as described above with reference to FIG. 1A.

FIGS. 3A-3E are cross-sectional views illustrating a method for fabricating the semiconductor device of FIG. 1B in accordance with an embodiment. The cross-sectional views are taken along the line A-A' of FIG. 1A.

Figure 3A:
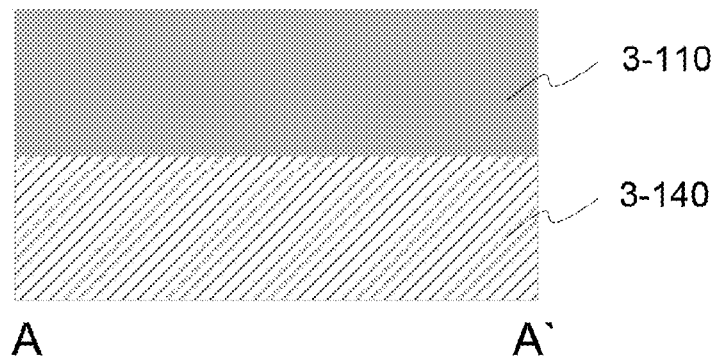
FIGS. 3A-3E are cross-sectional views illustrating a method for fabricating the semiconductor device of FIG. 1B in accordance with an embodiment.

Referring to FIG. 3A, a first conductive layer 3-110 is formed over a substrate 3-140.

Figure 3B:
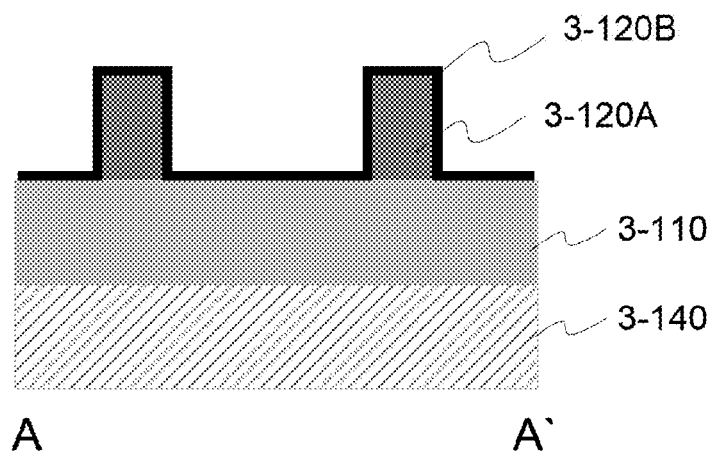

Referring to FIG. 3B, a reservoir layer 3-120A is formed by performing substantially the same processes as used for fabricating the insulation pattern 270 in FIG. 2D described above with reference to FIGS. 2A-2D. The reservoir layer 3-120A is formed using resolution enhancement techniques such as immersion lithography, PR reflow/RELACS, and highly anisotropic etching. The reservoir layer 3-120A may have a width that is smaller than a minimum feature size obtained by performing a conventional photolithography method.

Subsequently, a tunnel barrier layer 3-120B is conformally deposited along a surface of the resultant structure including the reservoir layer 3-120A and an exposed portion of the first conductive layer 3-110. Various deposition methods capable of forming a film with good step coverage may be used to form the tunnel barrier layer 3-120B. In an embodiment, an atomic layer deposition (ALD) method is used to form the tunnel barrier layer 3-120B.

Figure 3C:
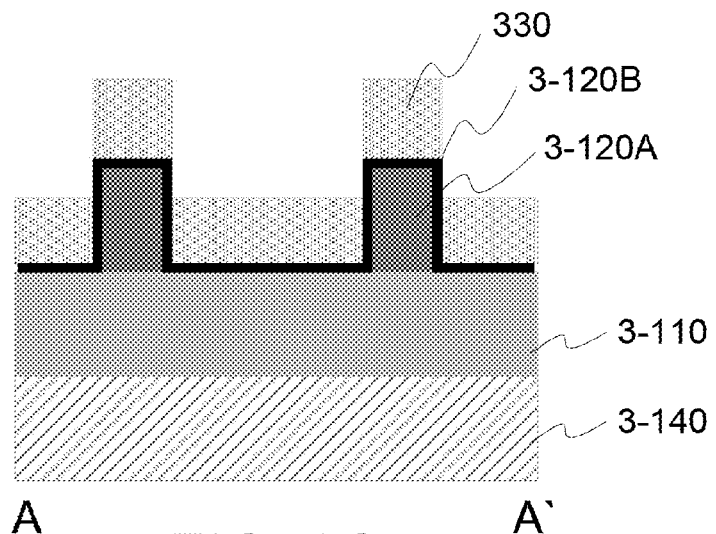

Referring to FIG. 3C, a first insulation material layer 330 is formed over the tunnel barrier layer 3-120B. In an embodiment, the first insulation material layer 330 includes an oxide layer. A material for forming the first insulation material layer 330 is deposited in a vertical direction with a small range of arrival angles by using an anisotropic deposition method such as a physical vapor deposition (PVD) method. For example, the material for forming the first insulation material layer 330 is deposited using collimated sputter deposition, ionized sputter deposition, or the like. As a result, the first insulation material layer 330 is not formed over a predetermined upper portion of sidewalls of the reservoir layer 3-120A.

Figure 3D:
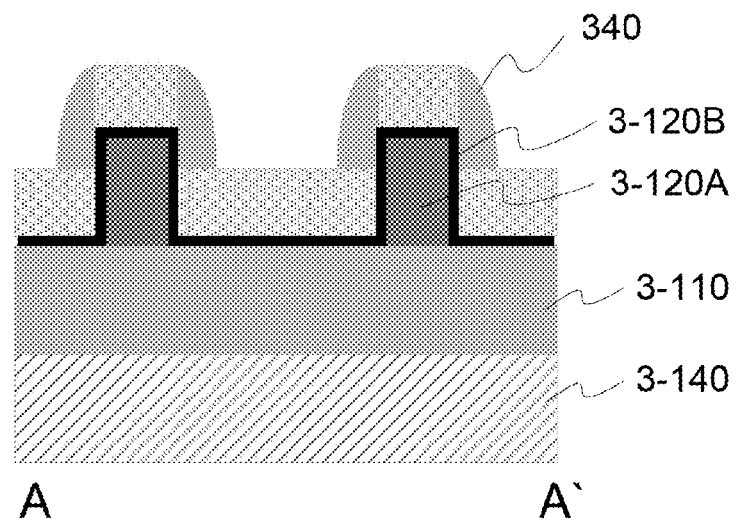

Referring to FIG. 3D, a second conductive pattern 340 is formed by performing substantially the same processes as used to form the conductive pattern 280 in FIG. 2E. As a result, the second conductive pattern 340 is formed to have a cross-section similar to a sidewall spacer.

Figure 3E:
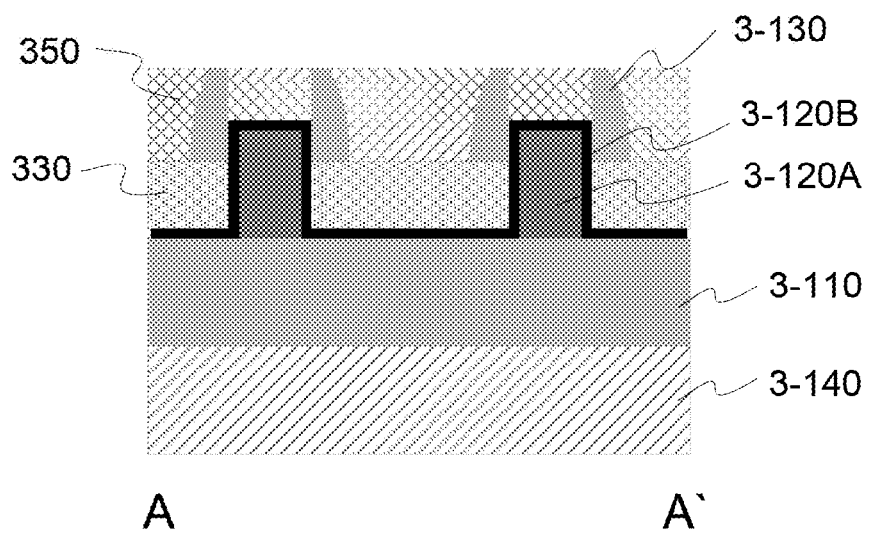

Referring to FIG. 3E, a second insulation material layer is deposited to fill spaces between the second conductive patterns 340 and then is planarized to form a second insulation layer 350. During the planarization process, the second conductive pattern 340 is also planarized to form a second conductive layer 3-130. The second conductive layer 3-130 has similar geometric features to the first conductive layer 2-110 that is formed as described above with reference to FIG. 2F.

In an embodiment, the first and second insulation layers 330 and 350 are formed using the same material. Thus, in an embodiment, the first insulation layer 330 and the second insulation layer 350 include an oxide layer.

FIGS. 4A-4E are cross-sectional views illustrating a method for fabricating the semiconductor device of FIG. 1C in accordance with an embodiment. The cross-sectional views are taken along the line A-A' of FIG. 1A.

Figure 4A:
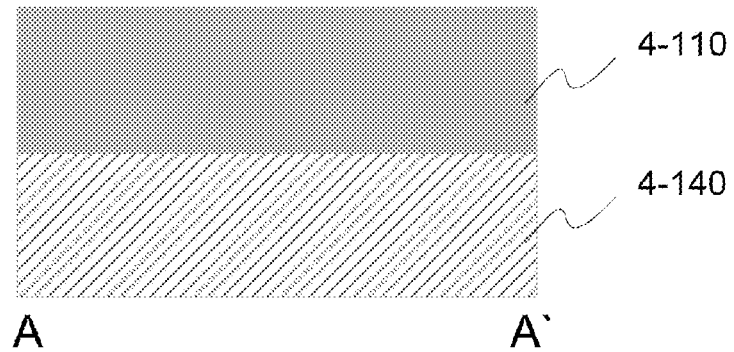
FIGS. 4A-4E are cross-sectional views illustrating a method for fabricating the semiconductor device of FIG. 1C in accordance with an embodiment.

Referring to FIG. 4A, a first conductive layer 4-110 is formed over a substrate 4-140.

Figure 4B:
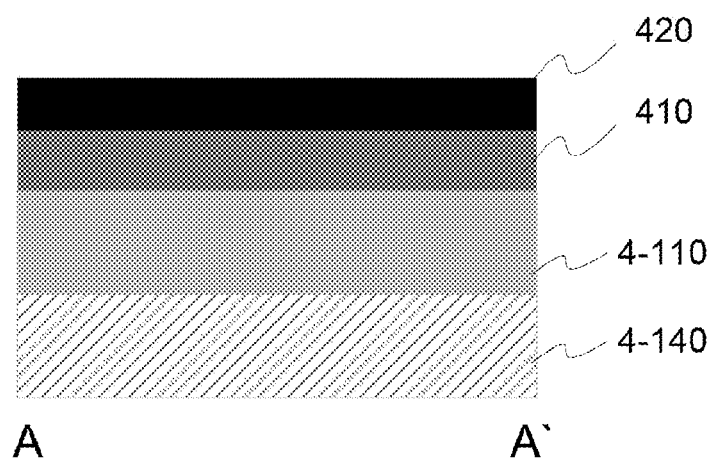

Referring to FIG. 4B, a reservoir material layer 410 is formed over the first conductive layer 4-110. Subsequently, a selector material layer 420 is formed over the reservoir material layer 410. In an embodiment, the selector material layer 420 is deposited using PVD, CVD, or ALD.

Figure 4C:
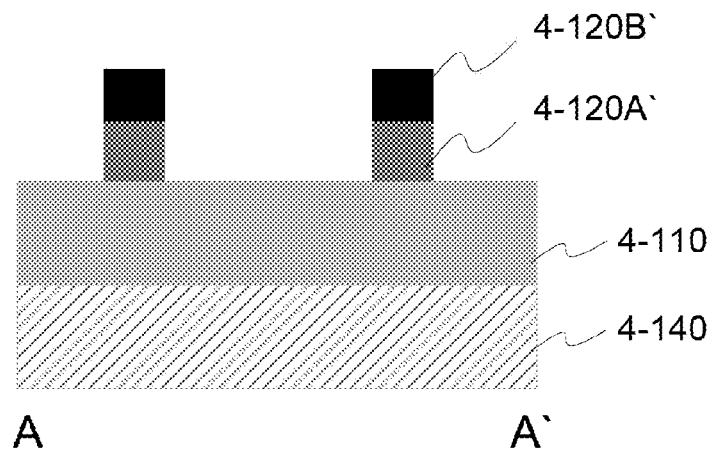

Referring to FIG. 4C, the reservoir material layer 410 and the selector material layer 420 are patterned by performing substantially the same processes as used for fabricating the insulation pattern 270 in FIG. 2D. As a result, a reservoir layer 4-120A' and a selector layer 4-120B' are formed to have a width that is smaller than a minimum feature size obtained by performing a conventional photolithography method.

Figure 4D:
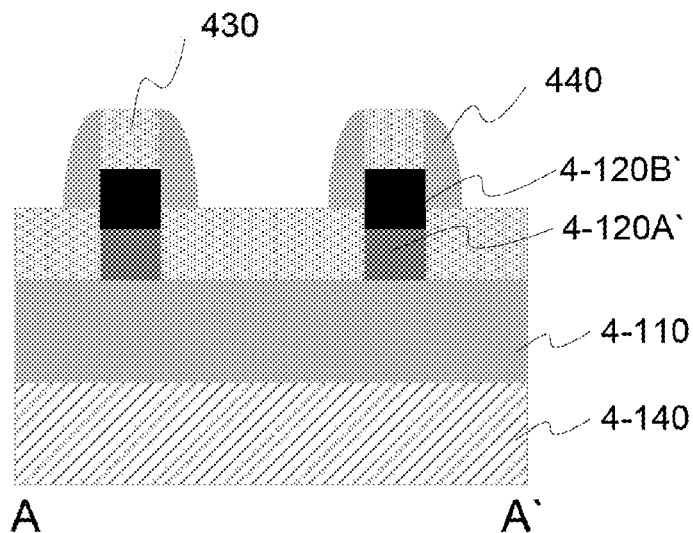

Referring to FIG. 4D, a first insulation material layer 430 is formed over the selector layer 4-120B' and the first conductive layer 4-110 so that the layers form a vertical stack. In an embodiment, the first insulation material layer 430 is formed so that it is not provided on a predetermined upper portion of sidewalls of the selector layer 4-120B'. In an embodiment, the first insulation material layer 430 includes an oxide layer. The first insulation material layer 430 may be formed by performing a deposition process such as collimated sputter deposition, ionized sputter deposition, or the like, that is used to form the first insulation material layer 330 shown in FIG. 3C. A thickness of the first insulation material layer 430 is greater than a thickness of the reservoir layer 4-120A' and smaller than a total thickness of the reservoir layer 4-120A' and the selector layer 4-120B'.

Subsequently, a second conductive pattern 440 is formed by performing substantially the same processes as used to form the conductive pattern 280 shown in FIG. 2E. As a result, the second conductive pattern 440 also has a cross-section similar to a sidewall spacer.

Figure 4E:
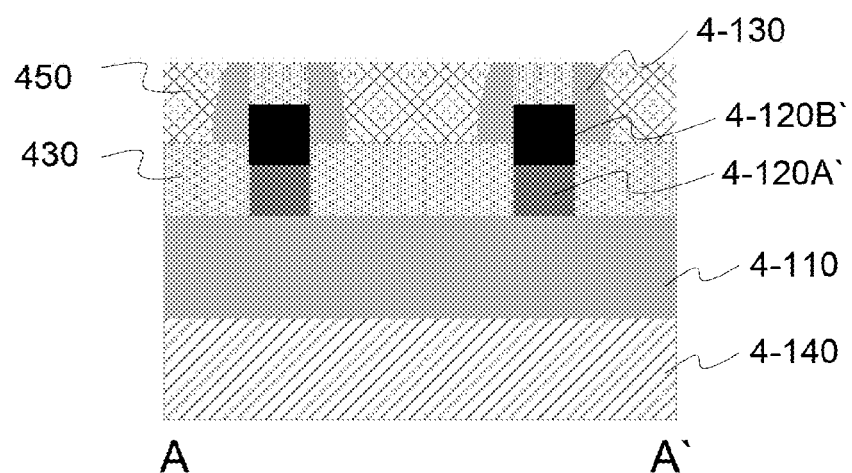

Referring to FIG. 4E, a second insulation material fills spaces between the second conductive patterns 440 and then is planarized to form a second insulation material layer 450. During the planarization process, the second conductive pattern 440 is also planarized to form a second conductive layer 4-130. The second conductive layer 4-130 has similar geometric features to the second conductive layer 3-130 shown in FIG. 3E. In an embodiment, the first and second insulation material layers 430 and 450 are formed using the same material.

Figure 5A:
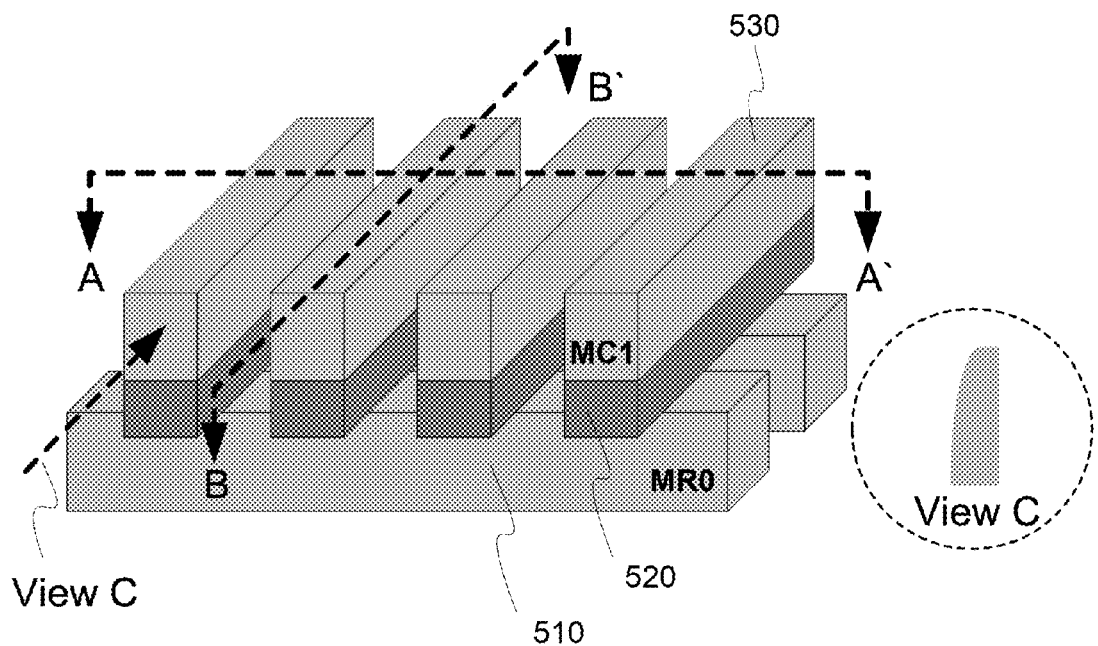
FIG. 5A is a perspective view illustrating a semiconductor device in accordance with another embodiment.

FIG. 5A is a perspective view illustrating a semiconductor device in accordance with another embodiment. The semiconductor device includes a first conductive layer 510 that extends in a first direction (e.g., a line A-A'), and a variable resistance layer 520 that extends in a second direction (e.g., a line B-B') and is formed over the first conductive layer 510. The semiconductor device also includes a second conductive layer 530 that extends in the second direction and is formed over the variable resistance layer 520. In an embodiment, the first direction is approximately perpendicular to the second direction.

In an embodiment, the first and second conductive layers 510 and 530 are configured to function as electrodes. In a memory cell array of the semiconductor device, the first conductive layer 510 may correspond to a bit line, and the second conductive layer 530 may correspond to a word line, and vice versa.

The variable resistance layer 520 acts as a variable resistance element that has a resistance state changing in response to an input signal (e.g., voltage or current) applied to the first and second conductive layers 510 and 530.

The variable resistance layer 520 may include a single layer or a plurality of layers. In an embodiment, the variable resistance layer 520 is a stacked structure of at least two different layers that show the variable resistance characteristics in combination.

Figure 5B:
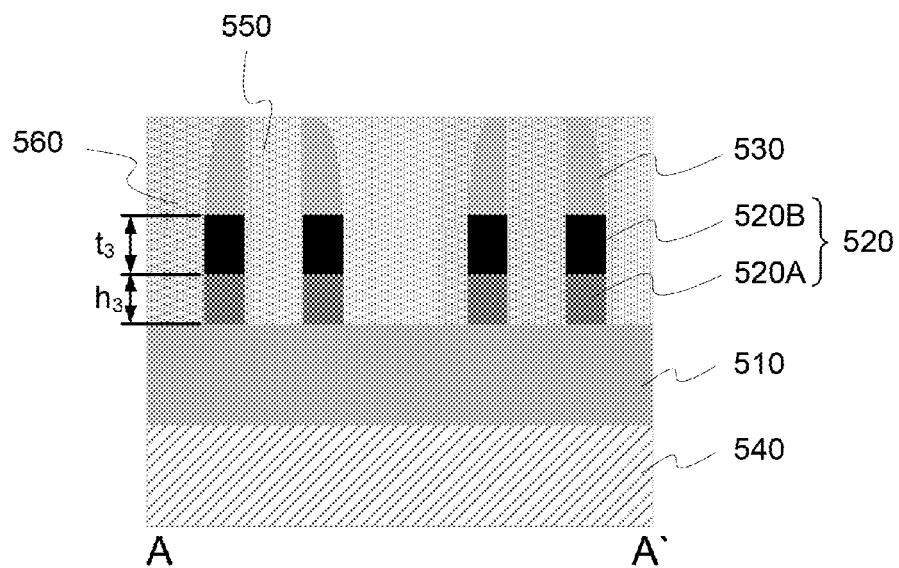
FIG. 5B is a cross-sectional view of a semiconductor device in accordance with another embodiment.

Referring to FIG. 5B, the stacked structure includes a reservoir layer 520A and a selector layer 520B. In an embodiment, the selector layer 520B includes a tunnel barrier layer.

In order to form filaments in the selector layer 520B, a filament formation region in the selector layer 520B may have a thickness $t_3$ that is sufficiently small to allow an electric field to penetrate therethrough and sufficiently large to prevent an electrical short from occurring through the selector layer 520B. In an embodiment, the thickness $t_3$ ranges from 1 nm to 5 nm.

In an embodiment, the selector layer 520B is configured to function as a selector to prevent sneak currents from flowing through unselected memory cells. In another embodiment, a selector (not shown) is formed over the selector layer 520B.

A height $h_3$ of the reservoir layer 520A may be greater than the thickness $t_3$ of the filament formation region in the selector layer 520B. In an embodiment, the height $h_3$ ranges from 10 nm to 50 nm.

As shown in View C of FIG. 5A, a cross-section of the second conductive layer 530 is similar to a sidewall spacer with a planarized top portion. The cross-section of the second conductive layer 530 has similar geometric features to the second conductive layer 130 shown in FIGS. 1B and 1C.

FIGS. 6A to 6E are cross-sectional views illustrating a method for fabricating the semiconductor device of FIG. 5B.

Figure 6A:
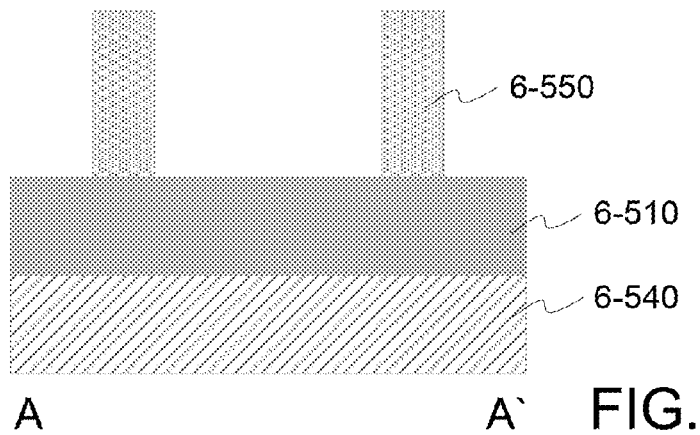
FIGS. 6A-6E are cross-sectional views illustrating a method for fabricating the semiconductor device of FIG. 5B in accordance with an embodiment.

Referring to FIG. 6A, a first conductive layer 6-510 is formed over a substrate 6-540 by performing substantially the same processes as used for forming the conductive layer 2-110 in FIG. 2F. Subsequently, an insulation layer 6-550 is formed over the first conductive layer 6-510 by performing a lithography resolution enhancement technique such as immersion lithography, PR reflow/RELACS, or high anisotropic etching. The insulation layer 6-550 is formed to perpendicularly cross the first conductive layer 6-510.

Figure 6B:
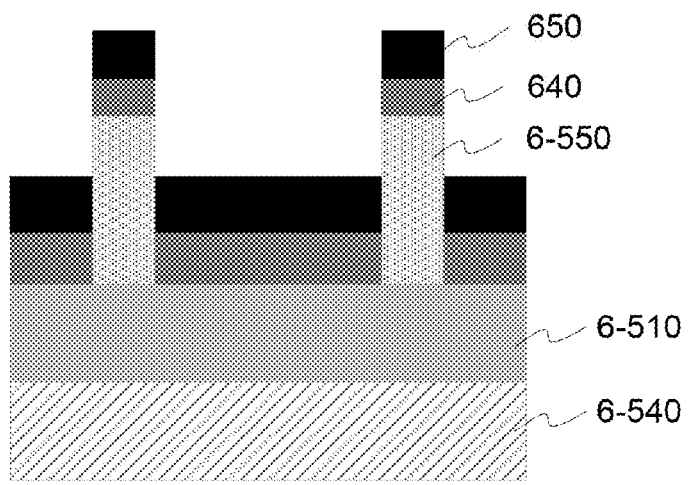

Referring to FIG. 6B, a reservoir material layer 640 is deposited over the insulation layer 6-550 and an exposed portion of the first conductive layer 6-510 in a substantially vertical direction with a small range of arrival angles by performing an anisotropic deposition method such as PVD method. For example, the reservoir material layer 640 is deposited using collimated sputter deposition, ionized sputter deposition, or the like, which is used to form the first insulation layer 330 in FIG. 3C.

After that, a selector material layer 650 is formed over the reservoir material layer 640. The selector material layer 650 is deposited in a substantially vertical direction with a small range of arrival angles by performing an anisotropic deposition method such as PVD.

In another embodiment, the selector material layer 650 is conformally formed over the reservoir material layer 640 and the insulation layer 6-550. Various deposition methods capable of forming a film with good step coverage (e.g., CVD and ALD) may be used to form the selector material layer 650.

Figure 6C:
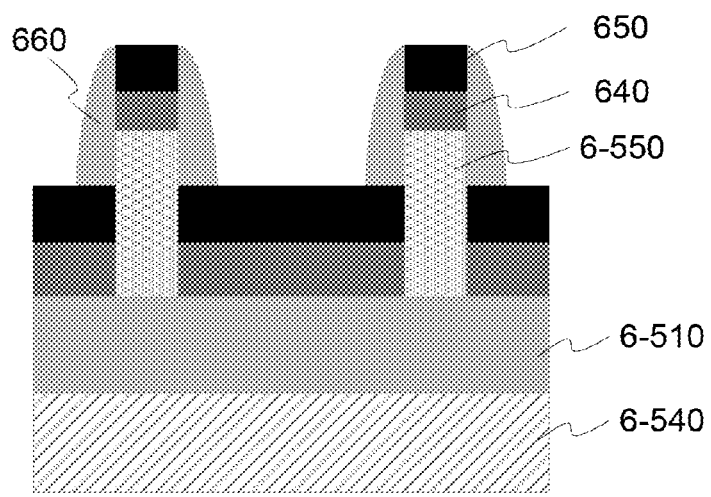

Referring to FIG. 6C, a conductive pattern 660 is formed on exposed sidewalls of the insulation layer 6-550 and sidewalls of the reservoir material layer 640 and the selector material layer 650 by performing substantially the same processes as used for forming the conductive pattern 280 in FIG. 2E. The conductive pattern 660 has a cross-section similar to a sidewall spacer.

Figure 6D:
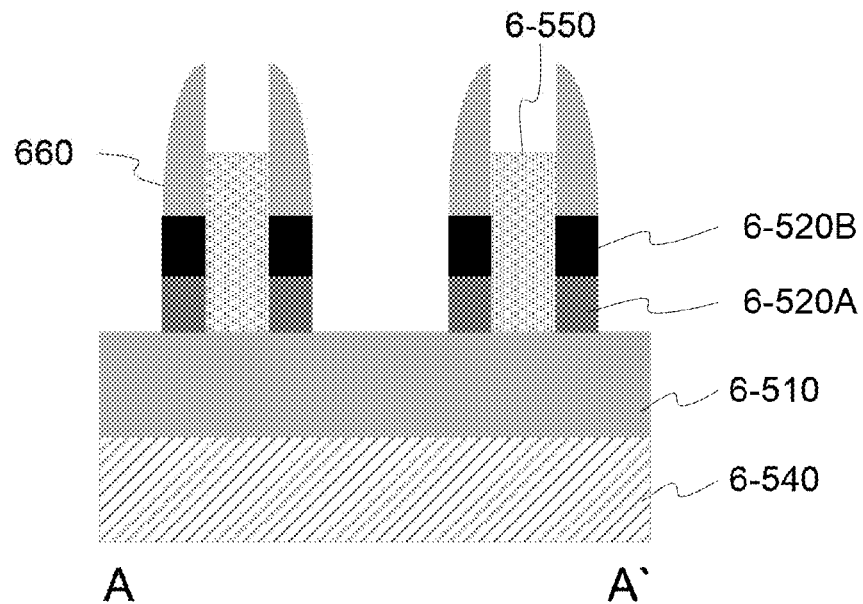

Referring to FIG. 6D, the selector material layer 650 and the reservoir material layer 640 are etched back in a substantially vertical direction using the conductive pattern 660 as an etch mask, so that the selector material layer 650 and the reservoir material layer 640 remain under the conductive pattern 660. During the etch-back process, an etching technique that is highly anisotropic (e.g., PE, RIE, or HDPE) may be used. As a result, a selector layer 6-520B and a reservoir layer 6-520A are formed under the conductive pattern 660.

Figure 6E:
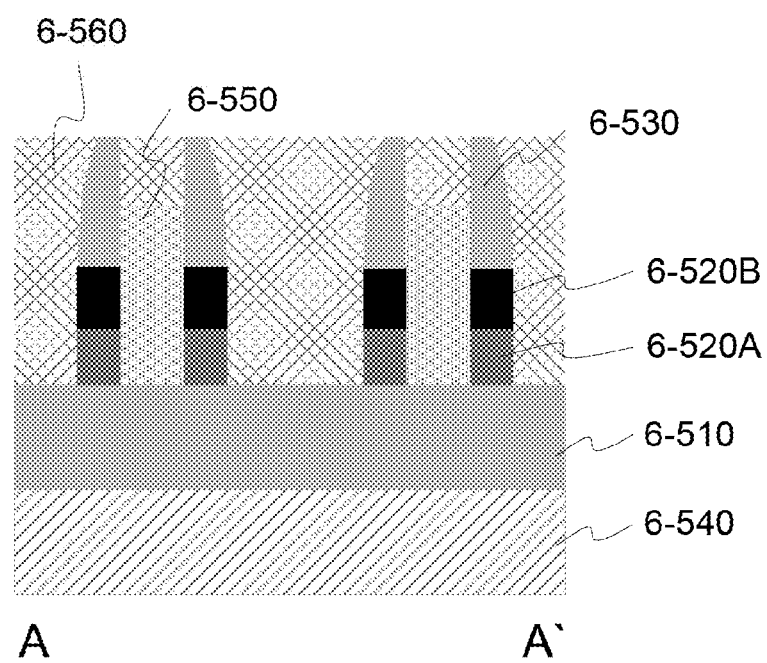

Referring to FIG. 6E, an insulation material is deposited to cover the resultant structure including the selector layer 6-520B and the reservoir layer 6-520A so as to fill spaces between the conductive patterns 660, and then the deposited insulation material is planarized by a predetermined depth to form a planarized insulation layer 6-560. During the planarization process, the conductive pattern 660 is also planarized to form a second conductive layer 6-530. The second conductive layer 6-530 has geometric features similar to the second conductive layer 3-130 in FIG. 3E.

Figure 7A:
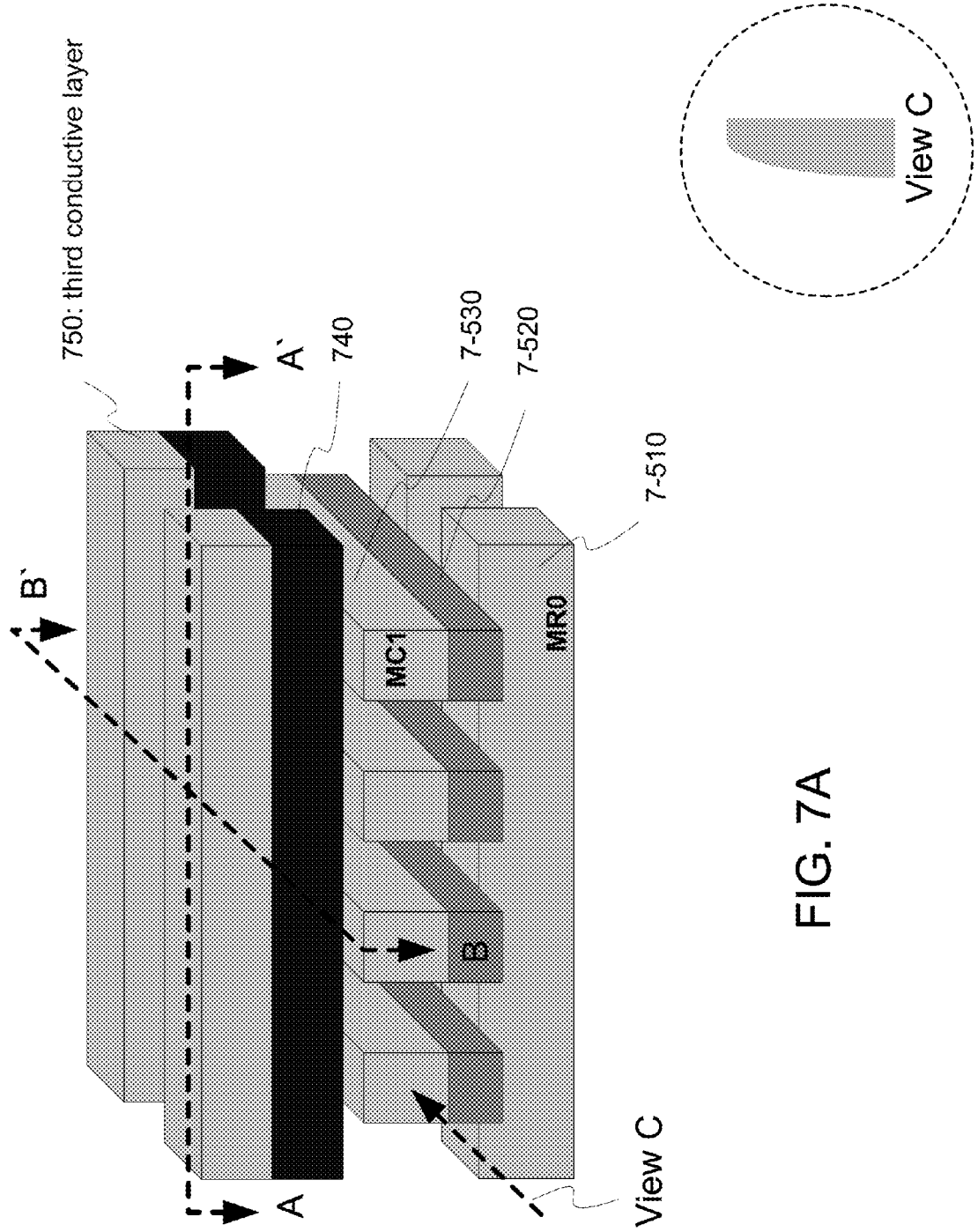
FIG. 7A is a perspective view illustrating a semiconductor device having a multi-layer structure in accordance with an embodiment.

FIG. 7A illustrates a semiconductor device in accordance with an embodiment, which has a multi-layer structure of a plurality of variable resistance layers. In an embodiment, the semiconductor device includes a second variable resistance layer 740 that extends in a first direction (e.g., a line A-A') and is formed over a second conductive layer 7-530. The second conductive layer 7-530, a first variable resistance layer 7-520, and a first conductive layer 7-510 correspond to the second conductive layer 530, the variable resistance layer 520, and the first conductive layer 510 in FIG. 5A, respectively. The semiconductor device further includes a third conductive layer 750 that extends in the first direction and is formed over the second variable resistance layer 740. Additional conductive layers (not shown) and variable resistance layers (not shown) may be repeatedly stacked in the manner described above.

In a stacked structure of FIG. 7A, the first to third conductive layers 7-510, 7-530, and 750 and the first and second variable resistance layers 7-520 and 740 form two vertically stacked memory cells, e.g., first and second memory cells. The first memory cell is implemented by the first conductive layer 7-510, the first variable resistance layer 7-520, and the second conductive layer 7-530. The second memory cell is implemented by the second conductive layer 7-530, the second variable resistance layer 740, and the third conductive layer 750. A detailed structure of the memory cells will be described with reference to embodiments shown in FIGS. 7B and 7C.

Figure 7B:
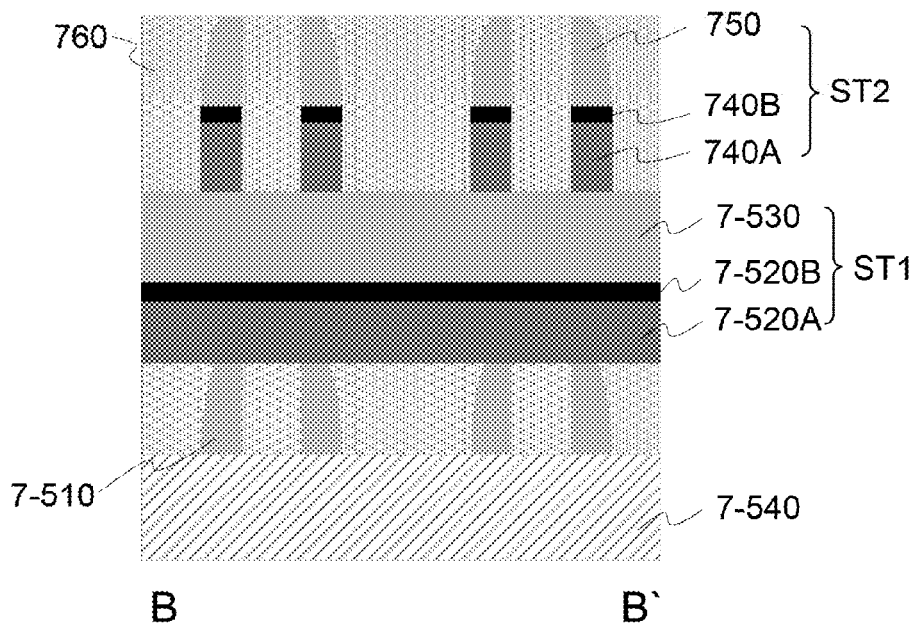
FIGS. 7B and 7C are cross-sectional views each illustrating a semiconductor having a multi-layer structure in accordance with an embodiment.
Figure 7C:
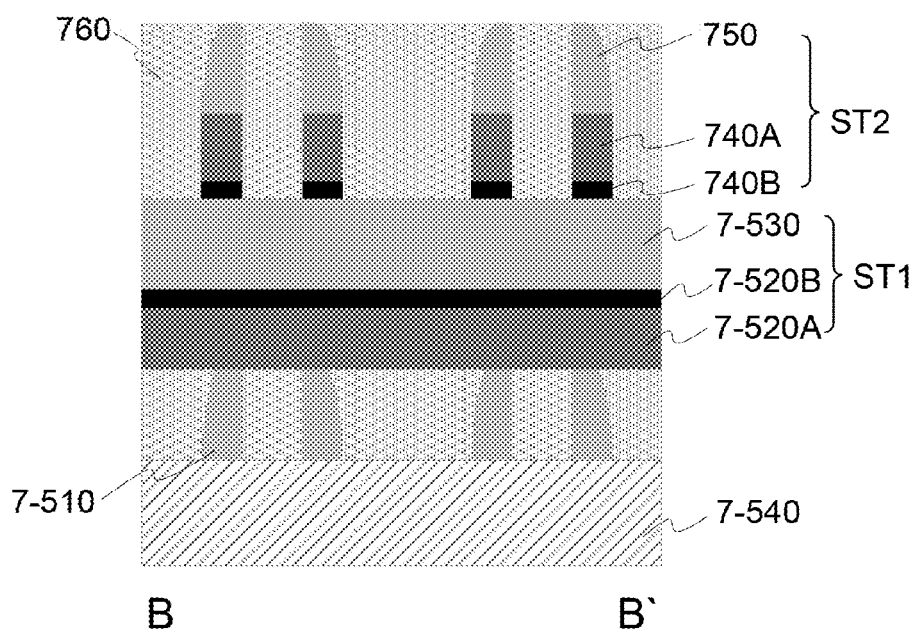

FIGS. 7B and 7C are cross-sectional views each illustrating a semiconductor device having a multi-layer structure in accordance with an embodiment. In these embodiments, each of first and second variable resistance layers includes a reservoir layer and a selector layer.

Referring to FIG. 7B, the semiconductor device includes a first stack structure ST1 and a second stack structure ST2. The first stack structure ST1 includes a first reservoir layer 7-520A, a first selector layer 7-520B, and a second conductive layer 7-530. The second stack structure ST2 includes a second reservoir layer 740A, a second selector layer 740B, and a third conductive layer 750. In this embodiment, the first stack structure ST1 includes layers stacked in the same order as those stacked in the second stack structure ST2. In the first and second stack structures ST1 and ST2, the selector layers, e.g., 7-520B and 740B, are formed over the reservoir layers, e.g., 7-520A and 740A, respectively.

The first, second, and third conductive layers 7-510, 7-530, and 750 are configured to function as electrodes of memory cells. For example, when a vertically stacked memory cell including the first variable resistance layer 7-520 is selected, the second conductive layer 7-530 may function as a bit line and the first conductive layer 7-510 may function as a word line. On the other hand, when another memory cell including the second variable resistance layer 740 is selected, the second conductive layer 7-530 may function as a word line and the third conductive layer 750 may function as a bit line. As such, each of the conductive layers may function as a bit line or a word line depending on which one of adjacent memory cells is selected.

Referring to FIG. 7C, in an embodiment, the semiconductor device includes a first stack structure ST1 and a second stack structure ST2. In this embodiment, the layers of the first stack structure ST1 are stacked in a different order from those of the second stack structure ST2. Specifically, while the first selector layer 7-520B is formed over the first reservoir layer 7-520A in the first stack structure ST1, the second reservoir layer 740A is formed over the second selector layer 740B in the second stack structure ST2. Thus, the first variable resistance layer 7-520 and the second variable resistance layer 740 have a symmetrical structure with respect to the second conductive layer 7-530. As a result, in an embodiment, the second conductive layer 7-530 is used as a shared bit line, and the first and third conductive layers 7-510 and 750 are used as word lines. In this embodiment, since the number of layers of the multi-layer structure in a cell array region is reduced using the shared bit line, fabrication processes of the semiconductor device may be simplified. Moreover, since control of activation and/or deactivation of bit lines and word lines becomes simpler, the number of decoders in a core region may be reduced. Manufacturing costs may be reduced at least for these reasons.

Figure 8A:
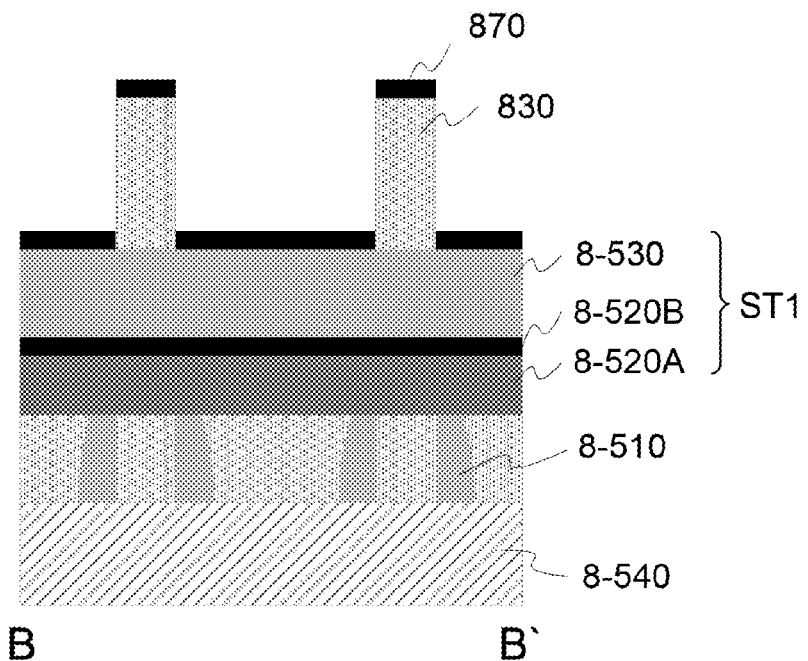
FIGS. 8A-8C are cross-sectional views illustrating a method for fabricating the semiconductor device of FIG. 7C in accordance with an embodiment.
Figure 8B:
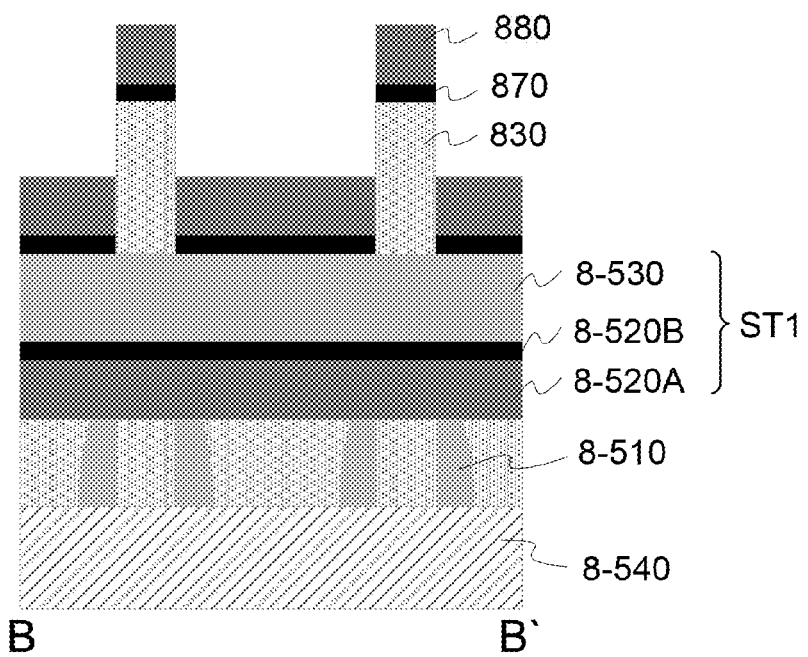
Figure 8C:
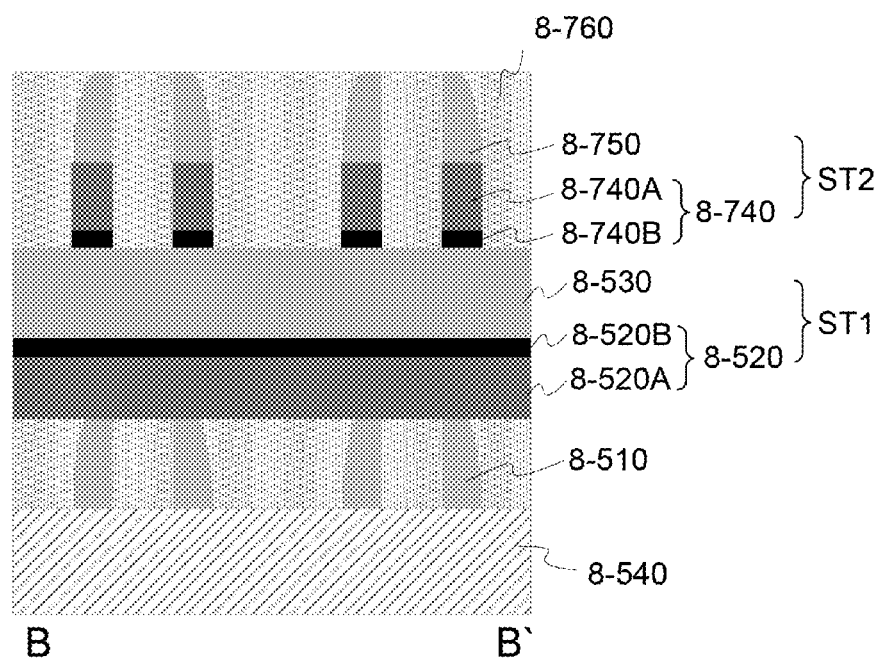

FIGS. 8A to 8C are cross-sectional views illustrating a method for fabricating a semiconductor device having the symmetrical structure of FIG. 7C in accordance with an embodiment. The cross-sections are taken along a line B-B' of FIG. 7A. One of skill in the art will understand that a method for fabricating a semiconductor device having the structure shown in FIG. 7B uses similar processes as those for fabricating a semiconductor device having the structure shown in FIG. 7C. Thus, a detailed description of a method for forming the structure shown in FIG. 7B will be omitted.

Referring to FIG. 8A, an insulation layer 830 is formed over a first stack structure ST1 that is formed as described above with reference to FIGS. 6A to 6E. The insulation layer 830 is formed using lithography resolution enhancement techniques such as immersion lithography, PR reflow/RELACS, and high anisotropic etching.

After that, a selector material layer 870 is formed over the insulation layer 830 and an exposed portion of the first stack structure ST1. In this embodiment, the selector material layer 870 is deposited in a substantially vertical direction with a small range of arrival angles by using an anisotropic deposition method, e.g., PVD.

In another embodiment, the selector material layer 870 is conformally formed over the insulation layer 830 and the exposed portion of the first stack structure ST1. Various deposition methods such as CVD and ALD, which are capable of forming a film with good step coverage, may be used to form the selector material layer 870.

Referring to FIG. 8B, a reservoir material layer 880 is deposited over the selector material 870 in a substantially vertical direction with a small range of arrival angles by using an anisotropic deposition method such as PVD. For example, the reservoir material layer 880 is deposited using collimated sputter deposition, ionized sputter deposition, or the like, which is used to form the reservoir material layer 640 shown in FIG. 6B.

Referring to FIG. 8C, the manufacturing processes described with reference to FIGS. 6C to 6E are performed on the resultant structure including the reservoir material layer 880 and the selector material layer 870. As a result, a second stack structure ST2 including a second selector layer 8-740B, a second reservoir layer 8-740A, and a third conductive layer 8-750 is formed. In this embodiment, a first variable resistance layer 8-520 in the first stack structure ST1 includes a first selector layer 8-520B that is formed over a first reservoir layer 8-520A, and a second variable resistance layer 8-740 in the second stack structure ST2 includes the second reservoir layer 8-740A that is formed over the second selector layer 8-740B. Thus, the first variable resistance layer 8-520 and the second variable resistance layer 8-740 are formed to have a symmetrical structure with respect to a second conductive layer 8-530 in the first stack structure ST1.

Figure 9:
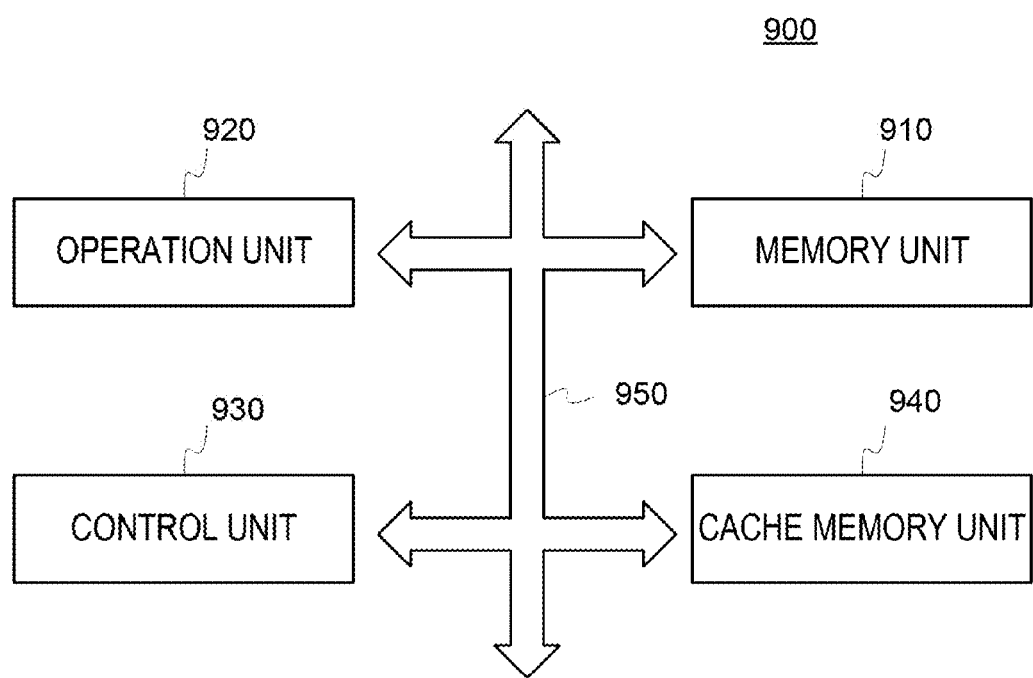
FIG. 9 is a diagram of a microprocessor including a semiconductor device in accordance with an embodiment.

FIG. 9 is a configuration diagram of a microprocessor including a semiconductor device in accordance with an embodiment.

Referring to FIG. 9, the microprocessor 900 may perform tasks for controlling and tuning a series of processes of receiving data from various external devices, processing the data, and outputting processing results to external devices. The microprocessor 900 may include a memory unit 910, an operation unit 920, and a control unit 930. The microprocessor 900 may be various types of processing units such as a central processing unit (CPU), a graphic processing unit (GPU), a digital signal processor (DSP) and an application processor (AP).

The memory unit 910 is a part which stores data in the microprocessor 900, as a processor register or a register. The memory unit 910 may include a data register, an address register and a floating point register. In addition, the memory unit 910 may include various registers. The memory unit 910 may perform the function of temporarily storing data for which operations are to be performed by the operation unit 920, result data from performing the operations, and an address where data for performing of the operations are stored.

The memory unit 910 may include one of the above-described semiconductor devices. The memory unit 910 including a semiconductor device as described herein may include a first conductive layer extending in a first direction; a second conductive layer extending in a second direction and disposed over the first conductive layer, the first and second directions being substantially perpendicular to each other; and a variable resistance layer disposed over the first conductive layer, the variable resistance layer extending in the second direction wherein an upper portion of the variable resistance layer is disposed between lower portions of two neighboring second conductive layers including said second conductive layer. Through this, a fabrication process of the memory unit 910 may become easy, scaling of the memory unit 910 may be possible and reliability of the memory unit 910 may be improved. As a consequence, a fabrication process of the microprocessor 900 is simplified, scaling of the microprocessor 900 may be possible, and the reliability of the microprocessor 900 may be improved.

The operation unit 920 is a part which performs operations in the microprocessor 900. The operation unit 920 performs arithmetical operations or logical operations according to signals transmitted from the control unit 930. The operation unit 920 may include at least one arithmetic logic unit (ALU).

The control unit 930 receives signals from the memory unit 910, the operation unit 920 and an external device of the microprocessor 900, performs extraction, decoding and controlling upon input and output of commands, and executes processing represented by programs.

The microprocessor 900 according to the present embodiment may additionally include a cache memory unit 940 which can temporarily store data to be inputted from an external device or to be outputted to an external device. In this case, the cache memory unit 940 may exchange data with the memory unit 910, the operation unit 920 and the control unit 930 through a bus interface 950.

Figure 10:
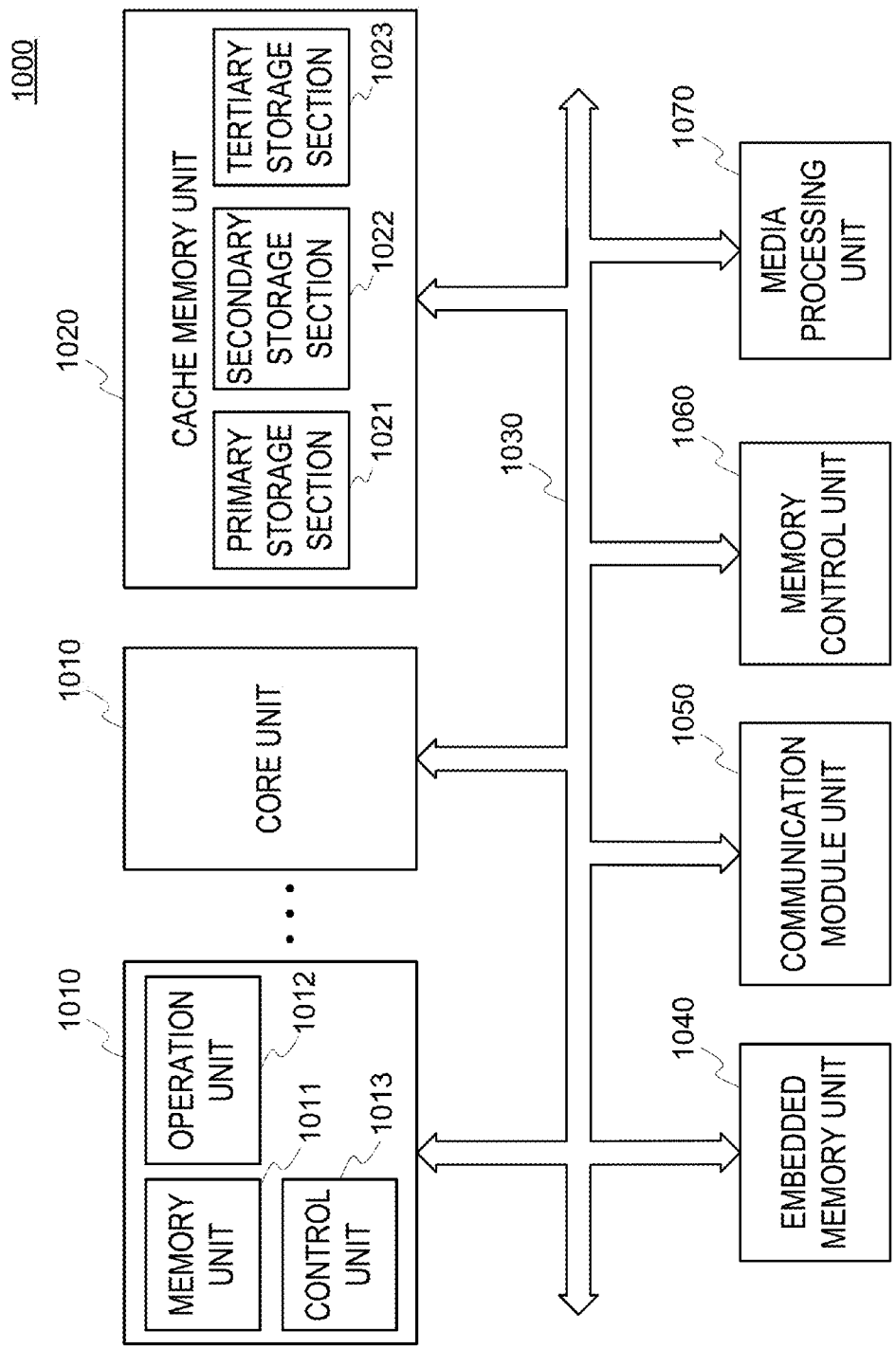
FIG. 10 is a processor including a semiconductor device in accordance with an embodiment.

FIG. 10 is a configuration diagram of a processor including a semiconductor device in accordance with an embodiment.

Referring to FIG. 10, a processor 1000 may improve performance and realize multi-functionality by including various functions in addition to controlling and tuning a series of processes of receiving data from various external devices, processing the data, and outputting processing results to external devices. The processor 1000 may include a core unit 1010, a cache memory unit 1020, and a bus interface 1030. The core unit 1010 is a part which performs arithmetic logic operations for data inputted from an external device, and may include a memory unit 1011, an operation unit 1012 and a control unit 1013. The processor 1000 may be various system-on-chips (SoCs) such as a multi-core processor, a graphic processing unit (GPU) and an application processor (AP).

The memory unit 1011 is a component which stores data in the processor 1000, as a processor register or a register. The memory unit 1011 may include a data register, an address register and a floating point register. In addition, the memory unit 1011 may include various registers. The memory unit 1011 may perform the function of temporarily storing (i) data for which operations are to be performed by the operation unit 1012, (ii) result data obtained by performing the operations and (iii) an address where data for performing of the operations are stored. The operation unit 1012 is a component which performs operations in the processor 1000. The operation unit 1012 performs arithmetical operations or logical operations in response to signals from the control unit 1013. The operation unit 1012 may also include at least one arithmetic logic unit (ALU). The control unit 1013 receives signals from the memory unit 1011, the operation unit 1012, and an external device of the processor 1000, performs extraction, decoding, controlling upon input and output of commands, and executes processing represented by programs.

The cache memory unit 1020 is a part which temporarily stores data to compensate for a difference in data processing speed between the core unit 1010 operating at a high speed and an external device operating at a low speed. The cache memory unit 1020 may include a primary storage section 1021, a secondary storage section 1022, and a tertiary storage section 1023. In general, the cache memory unit 1020 includes the primary and secondary storage sections 1021 and 1022, and may include the tertiary storage section 1023 when high storage capacity is desired. When appropriate, the cache memory unit 1020 may include an increased number of storage sections. That is to say, the number of storage sections which are included in the cache memory unit 1020 may be changed according to a chip design. The speeds at which the primary, secondary, and tertiary storage sections 1021, 1022 and 1023 store and discriminate data may be substantially the same or different. In the case where the speeds of the respective storage sections 1021, 1022 and 1023 are different, the speed of the primary storage section 1021 may be set to be the fastest. At least one storage section of the primary storage section 1021, the secondary storage section 1022, and the tertiary storage section 1023 of the cache memory unit 1020 may include one of the above-described semiconductor devices. The cache memory unit 1020 including the semiconductor device in accordance with an embodiment may include a first conductive layer extending in a first direction; a second conductive layer extending in a second direction and disposed over the first conductive layer, the first and second directions being substantially perpendicular to each other; and a variable resistance layer disposed over the first conductive layer, the variable resistance layer extending in the second direction, wherein an upper portion of the variable resistance layer is disposed between lower portions of two neighboring second conductive layers including said second conductive layer. Through this, a fabrication process of the cache memory unit 1020 may become easy, scaling of the cache memory unit 1020 may be possible and the reliability of the cache memory unit 1020 may be improved. As a consequence also, a fabrication process of the processor 1000 may become easy, scaling of the processor 1000 may be possible and the reliability of the processor 1000 may be improved.

Although it was shown in FIG. 10 that all the primary, secondary, and tertiary storage sections 1021, 1022 and 1023 are configured inside the cache memory unit 1020, the embodiments are not limited thereto. For example, it is to be noted that all the primary, secondary, and tertiary storage sections 1021, 1022 and 1023 of the cache memory unit 1020 may be configured outside the core unit 1010 and may compensate for a difference in data processing speed between the core unit 1010 and the external device. For another example, the primary storage section 1021 of the cache memory unit 1020 may be disposed inside the core unit 1010 and the secondary storage section 1022 and the tertiary storage section 1023 may be configured outside the core unit 1010 to strengthen the function of compensating for a difference in data processing speed.

The bus interface 1030 is a part which connects the core unit 1010 and the cache memory unit 1020 for effective transmission of data.

As shown in FIG. 10, the processor 1000 according to an embodiment may include a plurality of core units 1010, and the plurality of core units 1010 may share the same cache memory unit 1020. The plurality of core units 1010 and the cache memory unit 1020 may be connected through the bus interface 1030. The plurality of core units 1010 may be configured in substantially the same way as the above-described configuration of the core unit 1010. In the case where the processor 1000 includes the plurality of core units 1010, the primary storage section 1021 of the cache memory unit 1020 may be configured in each core unit 1010, and the secondary storage section 1022 and the tertiary storage section 1023 may be configured outside the plurality of core units 1010 in such a way as to be shared through the bus interface 1030.

In an embodiment, the processing speed of the primary storage section 1021 may be faster than the processing speeds of the secondary and tertiary storage section 1022 and 1023.

The processor 1000 may further include an embedded memory unit 1040 which stores data, a communication module unit 1050 which can transmit and receive data to and from an external device in a wired or wireless manner, a memory control unit 1060 which drives an external memory device, and a media processing unit 1070 which processes the data processed in the processor 1000 or the data inputted from an external input device and outputs the processed data to an external interface device. In addition, the processor 1000 may include a plurality of modules. In this case, the plurality of modules which are added may exchange data with the core units 1010, the cache memory unit 1020, and other units, through the bus interface 1030.

The embedded memory unit 1040 may include not only a volatile memory but also a nonvolatile memory. The volatile memory may include a dynamic random access memory (DRAM), a mobile DRAM, a static random access memory (SRAM), and the like. The nonvolatile memory may include a read only memory (ROM), a NOR flash memory, a NAND flash memory, a phase change random access memory (PRAM), a resistive random access memory (RRAM), a spin transfer torque random access memory (STTRAM), a magneto-resistive random access memory (MRAM), and the like.

The communication module unit 1050 may include both a module capable of being connected with a wired network and a module capable of being connected with a wireless network. The wired network module may include a local area network (LAN), a universal serial bus (USB), an Ethernet, power line communication (PLC), and the like. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), and the like.

The memory control unit 1060 is to administrate data transmitted between the processor 1000 and an external storage device operating according to a different communication standard. The memory control unit 1060 may include various memory controllers, for example, controllers for controlling IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The media processing unit 1070 processes the data processed in the processor 1000 or the data inputted from the external input device and output the processed data to the external interface device to be transmitted in the forms of image, voice and others, and may include a graphic processing unit (GPU), a digital signal processor (DSP), a high definition audio (HD audio), a high definition multimedia interface (HDMI) controller, and the like.

Figure 11:
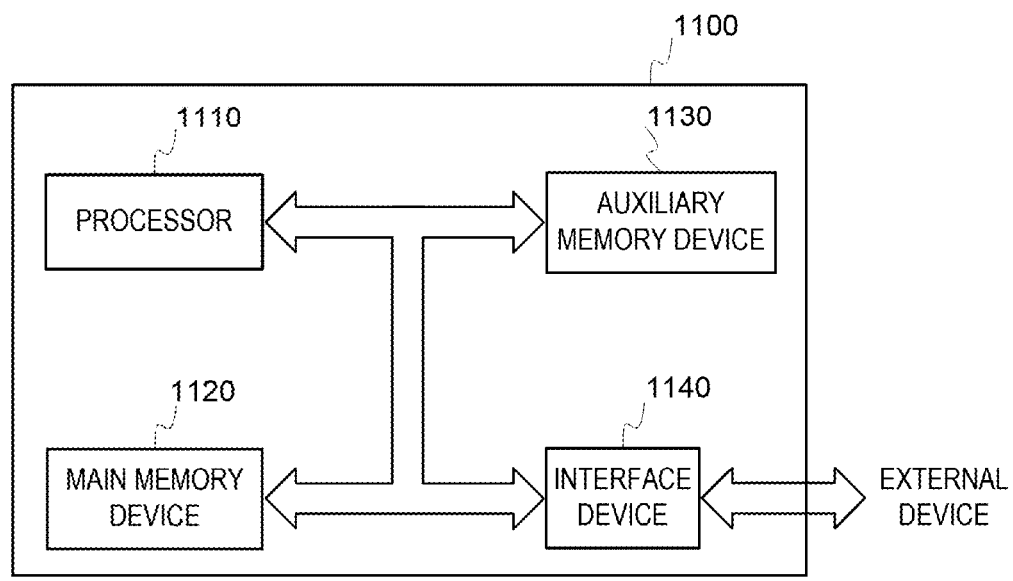
FIG. 11 is a diagram of a system including a semiconductor device in accordance with an embodiment.

FIG. 11 is a configuration diagram of a system in accordance with an embodiment.

Referring to FIG. 11, a system 1100 as an apparatus for processing data may perform input, processing, output, communication, storage, etc. to conduct a series of manipulations on data. The system 1100 may include a processor 1110, a main memory device 1120, an auxiliary memory device 1130, and an interface device 1140. The system 1100 of the present embodiment may comprise one of various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and the like.

The processor 1110 controls decoding of inputted commands and processing such as operation, comparison, etc. for the data stored in the system 1100, and may comprise a microprocessor unit (MPU), a central processing unit (CPU), a single/multi-core processor, a graphic processing unit (GPU), an application processor (AP), a digital signal processor (DSP), and the like.

The main memory device 1120 is a memory which can call and execute programs or data from the auxiliary memory device 1130 when programs are executed and can conserve memorized contents even when power supply is cut off. The main memory device 1120 may include one of the above-described semiconductor devices. The main memory device 1120 including a semiconductor device as described herein may include a first conductive layer extending in a first direction; a second conductive layer extending in a second direction and disposed over the first conductive layer, the first and second directions being substantially perpendicular to each other; and a variable resistance layer disposed over the first conductive layer, the variable resistance layer extending in the second direction, wherein an upper portion of the variable resistance layer is disposed between lower portions of two neighboring second conductive layers including said second conductive layer. Through this, a fabrication process of the main memory device 1120 may become easy, scaling of the main memory device 1120 may be possible and the reliability of the main memory device 1120 may be improved. As a consequence also, a fabrication process of the system 1100 may become easy, scaling of the system 1120 may be possible and the reliability of the system 1100 may be improved. Also, the main memory device 1120 may further include a volatile memory such as a static random access memory (SRAM), a dynamic random access memory (DRAM), and the like in which all contents are erased when power supply is cut off. Unlike this, the main memory device 1120 may not include the semiconductor devices according to the embodiments, but may include a static random access memory (SRAM), a dynamic random access memory (DRAM), and the like, of a volatile memory type in which all contents are erased when power supply is cut off.

The auxiliary memory device 1130 is a memory device for storing program codes or data. While the speed of the auxiliary memory device 1130 is slower than the main memory device 1120, the auxiliary memory device 1130 can store a larger amount of data. The auxiliary memory device 1130 may include one of the above-described semiconductor devices in accordance with the embodiments. The auxiliary memory device 1130 including the semiconductor device in accordance with the aforementioned embodiment may include a first conductive layer extending in a first direction; a second conductive layer extending in a second direction and disposed over the first conductive layer, the first and second directions being substantially perpendicular to each other; and a variable resistance layer disposed over the first conductive layer, the variable resistance layer extending in the second direction, wherein an upper portion of the variable resistance layer is disposed between lower portions fof two neighboring second conductive layers including said second conductive layer. Through this, a fabrication process of the auxiliary memory device 1130 may become easy, scaling of the auxiliary memory device 1130 may be possible and the reliability of the auxiliary memory device 1130 may be improved. As a consequence, a fabrication process of the system 1100 may become easy, scaling of the system 1100 may be possible and the reliability of the system 1100 may be improved.

Also, the auxiliary memory device 1130 may further include a data storage system (see the reference numeral 1200 of FIG. 12) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like. Unlike this, the auxiliary memory device 1130 may not include the semiconductor devices according to the embodiments, but may include data storage systems (see the reference numeral 1200 of FIG. 12) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The interface device 1140 may be to perform exchange of commands and data between the system 1100 of the present embodiment and an external device. The interface device 1140 may be a keypad, a keyboard, a mouse, a speaker, a mike, a display, various human interface devices (HIDs), and a communication device. The communication device may include both a module capable of being connected with a wired network and a module capable of being connected with a wireless network. The wired network module may include a local area network (LAN), a universal serial bus (USB), an Ethernet, power line communication (PLC), and the like. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), and the like.

Figure 12:
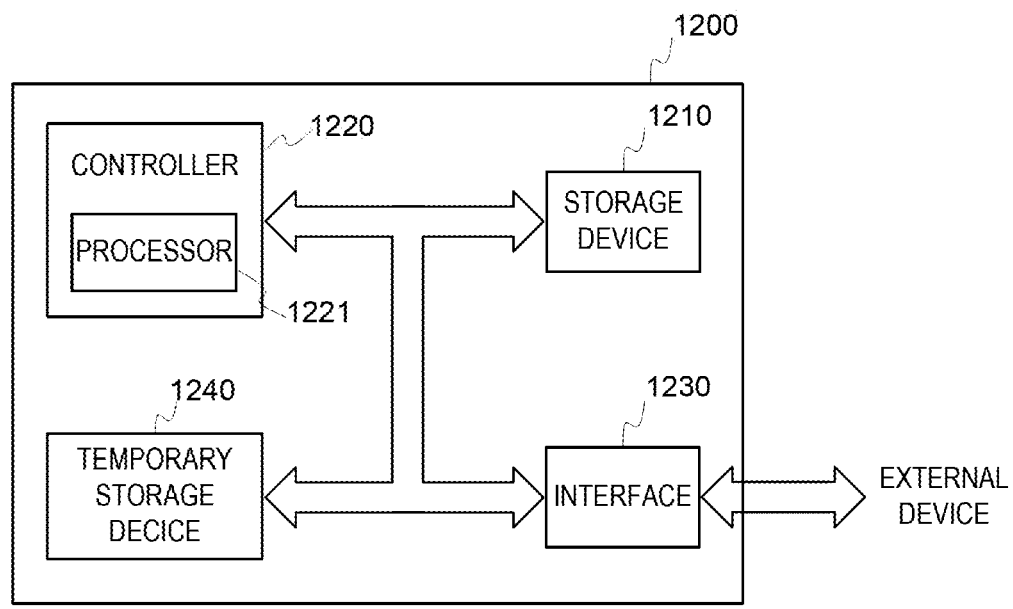
FIG. 12 is a diagram of a data storage system including a semiconductor device in accordance with an embodiment.

FIG. 12 is a configuration diagram of a data storage system in accordance with an embodiment.

Referring to FIG. 12, a data storage system 1200 may include a storage device 1210 which has a nonvolatile characteristic as a component for storing data, a controller 1220 which controls the storage device 1210, and an interface 1230 for connection with an external device. The data storage system 1200 may be a disk type such as a hard disk drive (HDD), a compact disc read only memory (CDROM), a digital versatile disc (DVD), a solid state disk (SSD), and the like, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The controller 1220 may control exchange of data between the storage device 1310 and the interface 1230. To this end, the controller 1220 may include a processor 1221 for performing an operation for and processing commands inputted through the interface 1230 from an outside of the data storage system 1200.

The interface 1230 is to perform exchange of commands and data between the data storage system 1200 and the external device. In the case where the data storage system 1200 is a card type, the interface 1230 may be an interface which is compatible with a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like. In the case where the data storage system 1200 is a disk type, the interface 1230 may be an interface which is compatible with IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and the like.

The data storage system 1200 according to the present embodiment may further include a temporary storage device 1240 for efficiently transferring data between the interface 1230 and the storage device 1210 according to diversification and high performance of an interface with an external device, a controller and a system. The storage device 1210 and the temporary storage device 1240 for temporarily storing data may include one of the above-described semiconductor devices in accordance with the embodiments. The storage device 1210 or the temporary storage device 1240 including the semiconductor device in accordance with the aforementioned embodiment may include a first conductive layer extending in a first direction; a second conductive layer extending in a second direction and disposed over the first conductive layer, the first and second directions being substantially perpendicular to each other; and a variable resistance layer disposed over the first conductive layer, the variable resistance layer extending in the second direction, wherein an upper portion of the variable resistance layer is disposed between lower portions of two neighboring second conductive layers including said second conductive layer. Through this, a fabrication process of the storage device 1210 or the temporary storage device 1240 may become easy, scaling the storage device 1210 of the temporary storage device 1240 may be possible and the reliability of the storage device 1210 or the temporary storage device 1240 may be improved. As a consequence, a fabrication process of the data storage system 1200 may become easy, scaling of the data storage system 1200 may be possible and the reliability of the data storage system 1200 may be improved.

Figure 13:
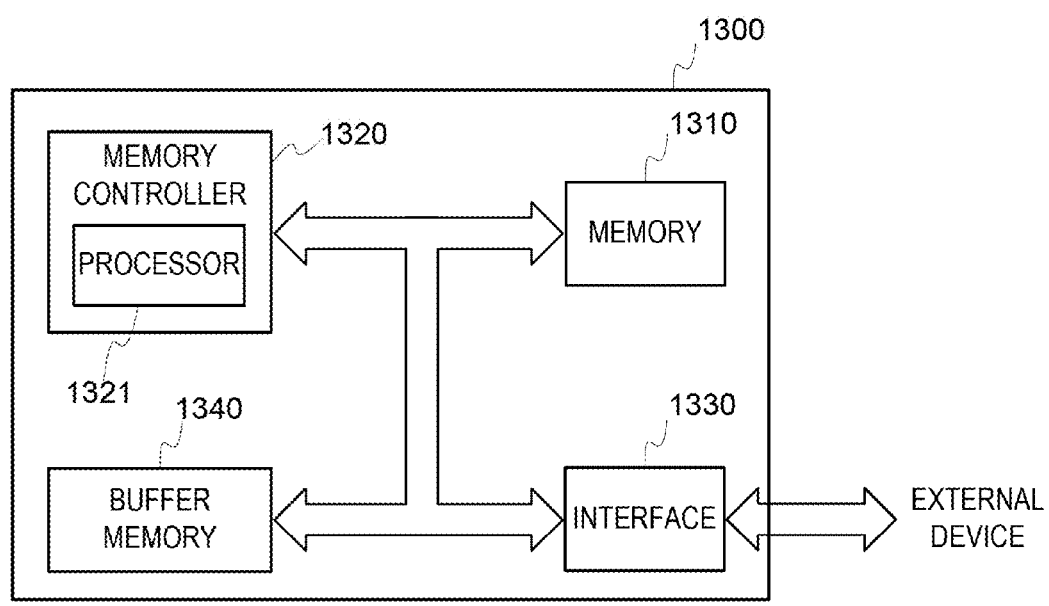
FIG. 13 is a diagram of a memory system including a semiconductor device in accordance with an embodiment.

FIG. 13 is a configuration diagram of a memory system in accordance with an embodiment.

Referring to FIG. 13, a memory system 1300 may include a memory 1310 which has a nonvolatile characteristic as a component for storing data, a memory controller 1320 which controls the memory 1310, and an interface 1330 for connection with an external device. The memory system 1300 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The memory 1310 for storing data may include one of the above-described semiconductor devices in accordance with the embodiments. The memory 1310 including the semiconductor device in accordance with the aforementioned embodiment may include a first conductive layer extending in a first direction; a second conductive layer extending in a second direction and disposed over the first conductive layer, the first and second directions being substantially perpendicular to each other; and a variable resistance layer disposed over the first conductive layer, the variable resistance layer disposed over the first conductive layer, the variable resistance layer extending in the second direction, wherein an upper portion of the variable resistance layer is disposed between lower portions of two neighboring second conductive layers including said second conductive layer. Through this, a fabrication process of the memory 1310 may become easy, scaling of the memory 1310 may be possible and the reliability of the memory 1310 may be improved. As a consequence, a fabrication process of the memory system 1300 may become easy, scaling of the memory system 1300 may be possible and the reliability of the memory system 1300 may be improved. Also, the memory 1310 according to the present embodiment may further include a ROM (read only memory), a NOR flash memory, a NAND flash memory, a phase change random access memory (PRAM), a resistive random access memory (RRAM), a magnetic random access memory (MRAM), and the like, which have a nonvolatile characteristic.

The memory controller 1320 may control exchange of data between the memory 1310 and the interface 1330. To this end, the memory controller 1320 may include a processor 1321 for performing an operation for and processing commands inputted through the interface 1330 from an outside of the memory system 1300.

The interface 1330 is to perform exchange of commands and data between the memory system 1300 and the external device. The interface 1330 may be compatible with a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The memory system 1300 according to the present embodiment may further include a buffer memory 1340 for efficiently transferring data between the interface 1330 and the memory 1310 according to diversification and high performance of an interface with an external device, a memory controller and a memory system. The buffer memory 1340 for temporarily storing data may include one of the above-described semiconductor devices in accordance with the embodiments.

The buffer memory 1340 including the semiconductor device in accordance with the aforementioned embodiment may include a first conductive layer extending in a first direction; a second conductive layer extending in a second direction and disposed over the first conductive layer, the first and second directions being substantially perpendicular to each other; and a variable resistance layer disposed over the first conductive layer, the variable resistance layer extending in the second direction, wherein an upper portion of the variable resistance layer is disposed between lower portions of two neighboring second conductive layers including said second conductive layer. Through this, a fabrication process of the buffer memory 1340 may become easy, scaling of the buffer memory 1340 may be possible and the reliability of the buffer memory 1340 may be improved. As a consequence, a fabrication process of the memory system 1300 may become easy, scaling of the memory system 1300 may be possible and the reliability of the memory system 1300 may be improved.

Moreover, the buffer memory 1340 according to the present embodiment may further include an SRAM (static random access memory), a DRAM (dynamic random access memory), and the like, which have a volatile characteristic, and a phase change random access memory (PRAM), a resistive random access memory (RRAM), a spin transfer torque random access memory (STTRAM), a magnetic random access memory (MRAM), and the like, which have a nonvolatile characteristic.

In another embodiment, the buffer memory 1340 may not include the semiconductor devices according to the embodiments, but may include an SRAM (static random access memory), a DRAM (dynamic random access memory), and the like, which have a volatile characteristic, and a phase change random access memory (PRAM), a resistive random access memory (RRAM), a spin transfer torque random access memory (STTRAM), a magnetic random access memory (MRAM), and the like, which have a nonvolatile characteristic.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. A semiconductor device, comprising:
   a first conductive layer extending in a first direction;
   a second conductive layer extending in a second direction and disposed over the first conductive layer, the first and second directions being substantially perpendicular to each other;
   an insulation layer disposed between two neighboring second conductive layers including said second conductive layer; and
   a variable resistance layer extending in the second direction and disposed between the first and second conductive layers.

2. The semiconductor device of claim 1, wherein the second conductive layer is formed by performing a process of forming sidewall spacers on sidewalls of the insulation layer.

3. The semiconductor device of claim 1, wherein the second conductive layer includes a first sidewall contacting the insulation layer and a second sidewall having a curved portion, the curved portion including a plurality of subsections having different curvatures.

4. The semiconductor device of claim 1, wherein the variable resistance layer includes a reservoir layer and a selector layer.

5. The semiconductor device of claim 4, wherein the selector layer comprises a metal oxide layer satisfying a stoichiometric ratio, and the reservoir layer comprises an oxygen-deficient metal oxide layer.

6. The semiconductor device of claim 1, wherein the variable resistance layer disposed over the first conductive layer corresponds to a first variable resistance layer, and the semiconductor device further comprises:
   a second variable resistance layer extending in the first direction and disposed over the second conductive layer; and
   a third conductive layer extending in the first direction and disposed over the second variable resistance layer.

7. The semiconductor device of claim 6, wherein the first variable resistance layer includes a first reservoir layer and a first selector layer, and the second variable resistance layer includes a second reservoir layer and a second selector layer.

8. The semiconductor device of claim 7, wherein the first selector layer is disposed over the first reservoir layer, and the second selector layer is disposed over the second reservoir layer.

9. The semiconductor device of claim 7, wherein the first selector layer is disposed over the first reservoir layer, and the second reservoir layer is disposed over the second selector layer.

10. The semiconductor device of claim 9, wherein the second conductive layer is configured to function as a bit line shared by two vertically stacked memory cells including the first and second variable resistance layers, respectively, as a resistance element, and the first and third conductive layers are configured to function as word lines.

* * * * *